(12) United States Patent
Liaw

(10) Patent No.: US 10,134,745 B2
(45) Date of Patent: Nov. 20, 2018

(54) CONDUCTIVE LAYERS WITH DIFFERENT THICKNESSES

(71) Applicant: TAIWAN SEMICONDUCTOR MANUFACTURING COMPANY LTD., Hsinchu (TW)

(72) Inventor: Jhon Jhy Liaw, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/462,259

(22) Filed: Mar. 17, 2017

(65) Prior Publication Data
US 2017/0194331 A1 Jul. 6, 2017

Related U.S. Application Data

(63) Continuation of application No. 14/969,730, filed on Dec. 15, 2015, now Pat. No. 9,620,510.
(Continued)

(51) Int. Cl.
  *H01L 27/11* (2006.01)
  *H01L 29/78* (2006.01)
  (Continued)

(52) U.S. Cl.
  CPC ...... *H01L 27/1104* (2013.01); *H01L 23/5286* (2013.01); *H01L 27/0207* (2013.01);
  (Continued)

(58) Field of Classification Search
  CPC ............. H01L 27/1104; H01L 27/0207; H01L 29/7851
  See application file for complete search history.

(56) References Cited

U.S. PATENT DOCUMENTS

| 2010/0213514 A1 | 8/2010 | Liaw |
| 2013/0182484 A1 | 7/2013 | Chong et al. |
| 2014/0145272 A1 | 5/2014 | Or-Bach et al. |

FOREIGN PATENT DOCUMENTS

| KR | 1020100096001 | 9/2010 |
| KR | 1020130083369 | 7/2013 |

OTHER PUBLICATIONS

Office action and search report from the Korean patent office dated Jul. 14, 2017, for counterpart application No. 10-2015-0181643, which cites KR1020100096001, US20140145272, KR1020130083369.
(Continued)

*Primary Examiner* — Matthew Reames
(74) *Attorney, Agent, or Firm* — WPAT, P.C., Intellectual Property Attorneys; Anthony King

(57) ABSTRACT

A semiconductor chip includes: a first conductive line formed in a first conductive layer, a second conductive line formed in a second conductive layer, and a third conductive line formed in a third conductive layer; wherein the first conductive line is longer than the second conductive line substantially along a first direction, the second conductive line is longer than the first conductive line and the third conductive line substantially along a second direction, the third conductive line is longer than the second conductive line substantially along the first direction, the first conductive layer has a thickness which is thicker than that of the second conductive layer, and the third conductive layer has a thickness which is substantially equal to or thicker than that of the first conductive layer.

20 Claims, 19 Drawing Sheets

Related U.S. Application Data

(60) Provisional application No. 62/094,428, filed on Dec. 19, 2014.

(51) Int. Cl.
*H01L 27/02* (2006.01)
*H01L 23/528* (2006.01)
*H01L 27/108* (2006.01)

(52) U.S. Cl.
CPC .... *H01L 29/7851* (2013.01); *H01L 27/10826* (2013.01); *H01L 27/10879* (2013.01)

(56) References Cited

OTHER PUBLICATIONS

US20100213514 corresponds to KR1020100096001.
US20130182484 corresponds to KR1020130083369.

CONDUCTIVE LAYERS WITH DIFFERENT THICKNESSES

PRIORITY CLAIM AND CROSS-REFERENCE

This application is a continuation application of U.S. application Ser. No. 14/969,730, filed on Dec. 15, 2015, which claims the benefit of U.S. Provisional Application No. 62/094,428, filed on Dec. 19, 2014, the disclosure of which is hereby incorporated by reference in its entirety.

BACKGROUND

A circuit array includes cells that are arranged in rows and columns, including, for example, row metal lines each coupled to a row of cells, and column metal lines each coupled to a column of cells. Accessing a cell involves enabling the cell through one of the row metal lines and the column metal lines, and passing data through the other of the row metal lines and column metal lines.

For example, for a static random access memory (SRAM) macro, each cell in the SRAM macro includes a storage device, a first access device, and a second access device. The storage device is configured with a storage node and a complementary storage node. The first access device is coupled between the storage node and a bit line and is controlled by a signal at a word line. The second access device is coupled between the complementary storage node and a complementary bit line and is controlled by the signal at the word line. The word line includes a metal line running along a row of cells. The bit line and complementary bit line include corresponding metal lines running along a column of cells. When a cell in the SRAM macro is accessed, a signal on the word line enables the row of cells for access. In this way, the first access device and second access device of the cell are turned on such that the corresponding bit line and the complementary bit line are coupled to the corresponding storage node and the complementary storage node. Further, data to be written or data read is passed along the bit line and the complementary bit line of the selected column of cells to or from the corresponding storage node and complementary storage node in the cell enabled for access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
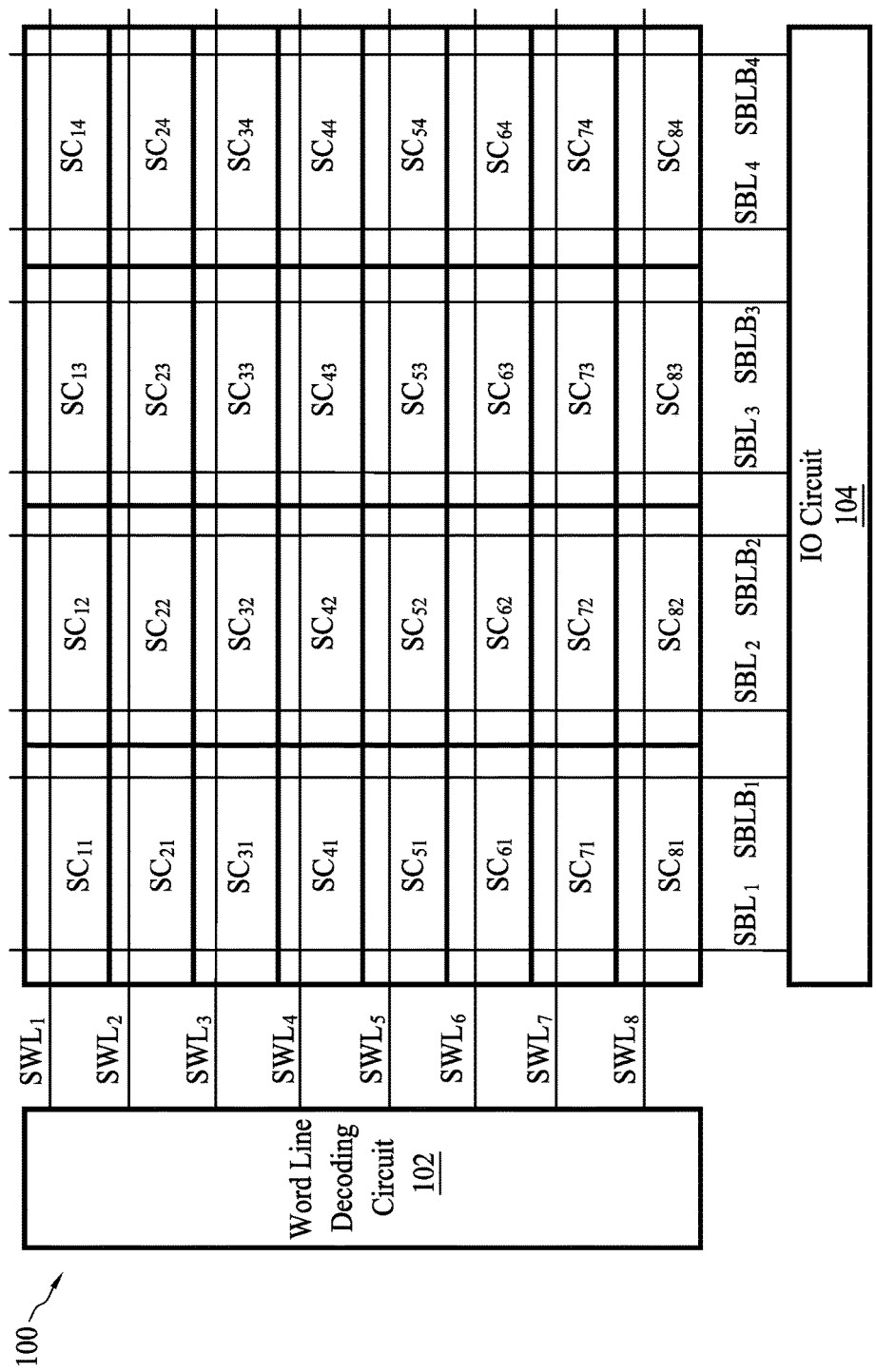
FIG. 1 is a schematic block diagram of an SRAM macro in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left", "right", "middle", "X direction", "Y direction", "Z direction", "horizontal", "vertical" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, it will be understood that when an element is referred to as being "connected to" or "coupled to" another element, it may be directly connected to or coupled to the other element, or intervening elements may be present.

SRAM Macro

FIG. 1 is a schematic block diagram of an SRAM macro 100 in accordance with some embodiments.

The SRAM macro 100 includes an array of cells $SC_{11}$, $SC_{12}$, ... and $SC_{84}$, a word line decoding circuit 102 and an input and output (IO) circuit 104. The word line decoding circuit 102 drives a plurality of word lines $SWL_1$, $SWL_2$, ... and $SWL_8$ running along corresponding rows of cells $SC_{11}$ to $SC_{14}$, $SC_{21}$ to $SC_{24}$, ... and $SC_{81}$ to $SC_{84}$. The IO circuit 104 drives or receives a plurality of bit lines $SBL_1$, $SBL_2$, ... and $SBL_4$ and a plurality of complementary bit lines $SBLB_1$, $SBLB_2$, ... and $SBLB_4$ running along corresponding columns of cells $SC_{11}$ to $SC_{81}$, $SC_{12}$ to $SC_{82}$, ... and $SC_{14}$ to $SC_{84}$. The word line decoding circuit 102 is configured to receive a row address, decode the row address and assert, for example, a corresponding one of the word lines $SWL_1$, $SWL_2$, ... and $SWL_8$ such that a corresponding row of the cells $SC_{11}$ to $SC_{14}$, $SC_{21}$ to $SC_{24}$, ... or $SC_{81}$ to $SC_{84}$ is enabled for access. The IO circuit 104 includes a pre-charging circuit, a sense amplifier and a data driver for each column of cells $SC_{11}$ to $SC_{81}$, $SC_{12}$ to $SC_{82}$, ... or $SC_{14}$ to $SC_{84}$ and further includes a column decoding circuit for the columns. For simplicity, the pre-charging circuits, sense amplifiers and the column decoding circuit are not shown in FIG. 1. The pre-charging circuit is configured to pre-charge a corresponding pair of bit line and complementary bit line $SBL_1$ and $SBLB_1$, $SBL_2$ and $SBLB_2$, ... or $SBL_4$ and $SBLB_4$ to prepare for a subsequent read or write operation. The sense amplifier is configured to sense data based on differential voltages received through the corresponding pair of bit line and complementary bit line $SBL_1$ and $SBLB_1$, $SBL_2$ and $SBLB_2$, ... or $SBL_4$ and $SBLB_4$ during a read operation. The data driver is configured to drive the corresponding pair of bit line and complementary bit line $SBL_1$ and $SBLB_1$, $SBL_2$ and $SBLB_2$, ... or $SBL_4$ and $SBLB_4$ based on data to be written during a write operation. The column decoding circuit is configured to receive a column address, decode the column address and output data from the sense amplifier or input data to the data driver selected in response to the decoded column address.

When the number of columns of the SRAM macro 100 is increased, the metal line for the word line $SWL_1$, $SWL_2$ ... or $SWL_8$ is lengthened, causing resistance of the word line $SWL_1$, $SWL_2$ ... or $SWL_8$ to be increased. In addition, down-scaling of the dimensions of the metal line with the advancement of technology also causes the resistance of the word line $SWL_1$, $SWL_2$ ... or $SWL_8$ to be increased. Furthermore, in some embodiments, an SRAM macro includes split word line cells (not shown) for providing lithography friendly layout shapes for fin structures, gate structures and metal lines. Compared to each cell $SC_{11}$, $SC_{12}$, ... or $SC_{84}$ of the SRAM macro 100, each split word line cell has a longer word line and a shorter pair of bit line and complementary bit line, which can further increase the resistance of the word line. Consequently, the delay in enabling access of the corresponding row of cells $SC_{11}$ to $SC_{14}$, $SC_{21}$ to $SC_{24}$, ... or $SC_{81}$ to $SC_{84}$ is increased. Moreover, when the number of rows is increased, the metal lines for each pair of bit line and complementary bit line $SBL_1$ and $SBLB_1$, $SBL_2$ and $SBLB_2$, ... or $SBL_4$ and $SBLB_4$ are lengthened, resulting in capacitance on the bit line $SBL_1$, $SBL_2$ ... or $SBL_4$ and capacitance on the complementary bit line $SBLB_1$, $SBLB_2$, ... or $SBLB_4$ to be increased. Therefore, delay for the differential voltages to be established for sensing or writing is increased due to the increased capacitive load asserted on the bit line $SBL_1$, $SBL_2$ ... or $SBL_4$ and the complementary bit line $SBLB_1$, $SBLB_2$ ... or $SBLB_4$. In some embodiments, to solve the above problem, the metal lines of the bit lines and the metal lines of the word lines may be disposed on different metal layers, and/or the metal lines of the bit lines and the metal lines of the word lines may be designed to have different thicknesses. The detailed reason is described in the following paragraphs. The metal lines and the metal layers are not the limitations of the present disclosure. The metal lines may be any conductive lines and the metal layers may be any conductive layers.

For simplicity, the SRAM macro 100 is exemplarily shown as a single bank memory. In some embodiments, a single bank memory includes an array of cells and accessing circuitry that access the array of cells under a flat addressing scheme. Under the flat addressing scheme, each cell in the array of cell has a row address and a column address. In some embodiments, a multi-bank memory includes multiple arrays of cells and global and local accessing circuitry that access the multiple arrays of cells under a hierarchical addressing scheme. Under the hierarchical addressing scheme, each cell in the multiple arrays of cells has a bank address, a row address and a column address. A multi-bank memory that has a memory bank and its local accessing circuitry similar to the SRAM macro 100 is within the contemplated scope of the present disclosure. As an example for illustration, the SRAM macro 100 has 8 rows and 4 columns. Other numbers of rows and/or columns are within the contemplated scope of the present disclosure.

Figure 2:
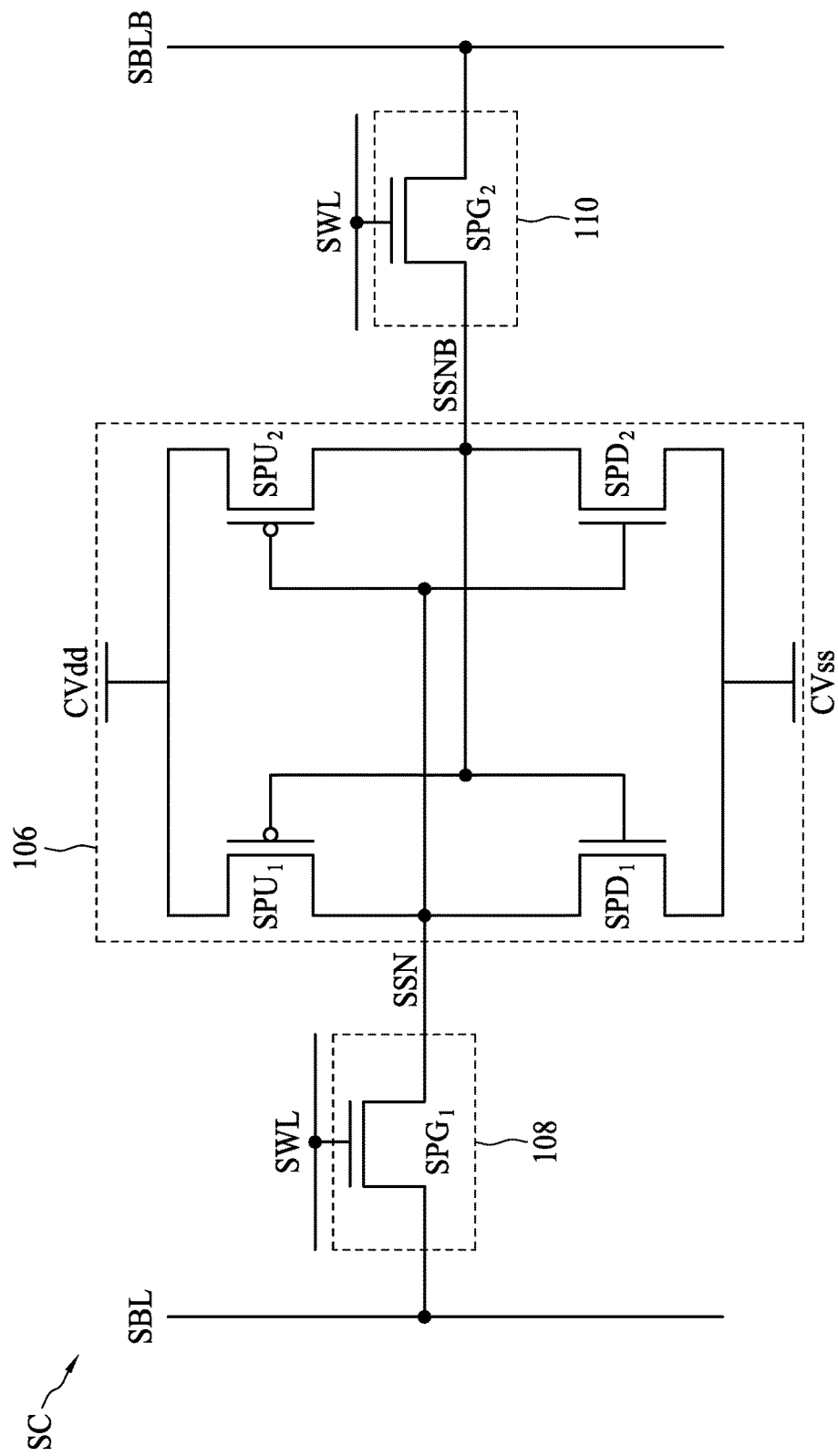
FIG. 2 is a schematic circuit diagram of the cell in the SRAM macro in FIG. 1 in accordance with some embodiments.

FIG. 2 is a schematic circuit diagram of the cell $SC_{11}$, $SC_{12}$, ... or $SC_{84}$ (representatively denoted as SC) in the SRAM macro 100 in FIG. 1 in accordance with some embodiments. FIG. 2 illustrates elements of the cell SC. The elements of each cell are representatively denoted by reference names without subscripts. The cell SC includes a storage device 106 and access devices 108 and 110. The storage device 106 is configured with a higher power supply node CVdd, a lower power supply node CVss, a storage node SSN and a complementary storage node SSNB. The storage device 106 is configured to hold data at the storage node SSN and the complementary storage node SSNB. The access devices 108 is configured to couple a bit line SBL to the storage node SSN in response to a signal at a word line SWL. The access device 110 is configured to couple a complementary bit line SBLB to the complementary storage node SSNB in response to the signal at the word line SWL.

In some embodiments, the storage device 106 includes a cross-coupled inverter pair. A first inverter of the inverter pair includes a P-type field effect transistor (P-FET) $SPU_1$, and an N-FET $SPD_1$. A source of the P-FET $SPU_1$ is coupled to the higher power supply node CVdd. A source of the N-FET $SPD_1$ is coupled to the lower power supply node CVss. Drains of the P-FET $SPU_1$ and the N-FET $SPD_1$ are coupled together to the storage node SSN. Gates of the P-FET $SPU_1$ and the N-FET $SPD_1$ are coupled together to the storage node SSNB. A second inverter of the inverter pair includes a P-FET $SPU_2$ and an N-FET $SPD_2$. A source of the P-FET $SPU_2$ is coupled to the higher power supply node CVdd. A source of the N-FET $SPD_2$ is coupled to the lower power supply node CVss. Drains of the P-FET $SPU_2$ and the N-FET $SPD_2$ are coupled together to the complementary storage node SSNB. Gates of the P-FET $SPU_2$ and the N-FET $SPD_2$ are coupled together to the storage node SSN.

The access device 108 includes an N-FET $SPG_1$ of which a gate is coupled to the word line SWL, a first source or drain is coupled to the storage node SSN and a second source or drain is coupled to the bit line SBL. The access device 110 includes an N-FET $SPG_2$ of which a gate is coupled to the word line SWL, a first source or drain is coupled to the complementary storage node SSNB and a second source or drain is coupled to the complementary bit line SBLB.

A bit line SBL is also called a data line and a complementary bit line SBLB is also called a complementary data line because the bit line SBL and the complementary bit line SBLB carries data for the cell SC. A word line SWL is also referred to as a control line as the word line SWL controls whether access devices 108 and 110 are turned on.

The foregoing outlines features of SRAM macro so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Figure 3:
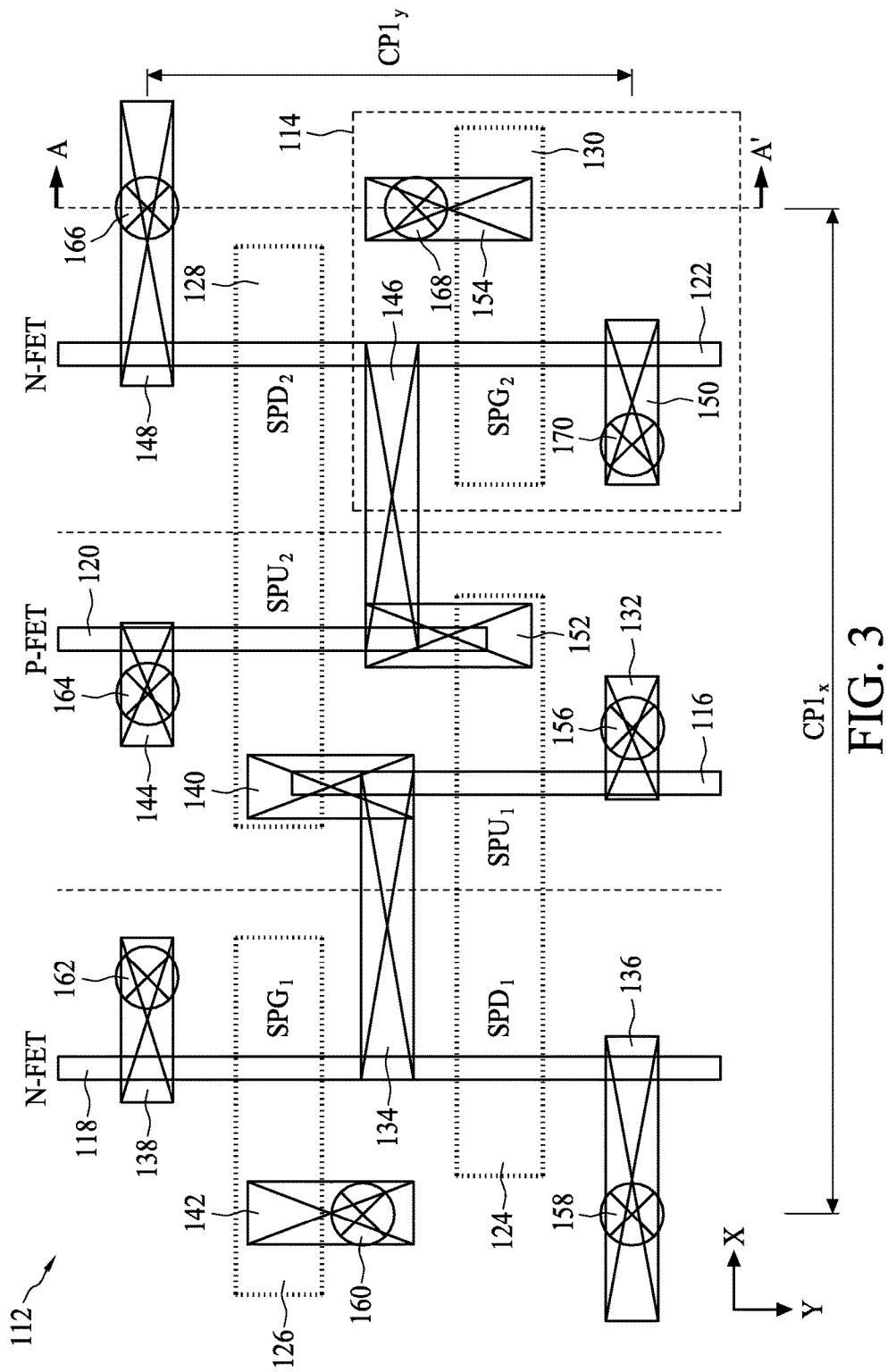
FIG. 3 is a schematic layout diagram of a front-end of line (FEOL) and via0 layer portion of the cell in FIG. 2 in accordance with some embodiments.

SRAM Cell with Metal Lines for Lower Power Supply Node on Opposite Sides of Word Line FIG. 3 is a schematic layout diagram 112 of a front-end of line (FEOL) and via0 layer portion of the cell SC in FIG. 2 in accordance with some embodiments. FIG. 3 illustrates the cell SC implemented by single-finned FinFETs. In some embodiments, the FEOL portion is the portion of integrated circuit (IC) fabrication where devices such as transistors are patterned and includes, for example, device layers and a contact layer before the via0 layer. The formation of the via0 layer is considered the beginning of a back-end of line (BEOL) portion of the IC fabrication that includes, for example, stacked metal layers and via layers interposed between the metal layers. The via0 layer is the layer of via between the FEOL contact layer and a BEOL metal layer M1.

The layout diagram 112 includes a plurality of fin structures 116, 118, 120 and 122 running substantially along a Y direction, a plurality of gate structures 124, 126, 128 and 130 running substantially along an X direction, a plurality of source or drain contacts 132, 134, 136, 138, 144, 146, 148 and 150 running substantially along the X direction, a plurality of gate contacts 140, 142, 152 and 154 running substantially along the Y direction, and a plurality of vias 156, 158, 160, 162, 164, 166, 168 and 170 in the via0 layer. In some embodiments, the X direction is along rows of cells such as the row of cells $SC_{11}$, $SC_{12}$ ... and $SC_{14}$ (shown in FIG. 1), and the Y direction is along columns of cells such as the column of cells $SC_{11}$, $SC_{21}$ ... and $SC_{81}$. In some embodiments, a layout of the array of cells $SC_{11}$, $SC_{12}$ ... and $SC_{84}$ has a first dimension along the X direction and a second dimension along the Y direction.

In some embodiments, the term "substantially along," "substantially in parallel" or "substantially orthogonal" for a first direction and a second direction refers to the first direction within a deviation angle such as 5 degrees, 10 degrees, and 15 degrees, etc., from a reference direction. For "substantially along" or "substantially in parallel," the reference direction is the second direction, and for "substantially orthogonal," the reference direction is 90 degrees from the second direction. Other ways to determine the first direction being "substantially along,", "substantially in parallel" or "substantially orthogonal" to the second direction are within the contemplated scope of the present disclosure. For example, a ratio of a deviation angle of the first direction from a first reference direction and a deviation angle of the second direction from a second reference direction is greater than a percentage such as 85%, 90% and 95%, etc. For "substantially along" or "substantially in parallel", the first reference direction is the same as the second reference direction, and for "substantially orthogonal", the first reference direction is 90 degrees from the second reference direction. For another example, a difference between a deviation angle of the first direction from the first reference direction and a deviation angle of the second direction from the second reference direction is less than a percentage such as 5%, 10% and 15%, etc., of the deviation angle of the second direction from the second reference direction.

The layout diagram 112 includes three portions. The middle portion is dedicated to the P-FETs $SPU_1$ and $SPU_2$, the left portion corresponds to the N-FETs $SPD_1$ and $SPG_1$ and the right portion belongs to the N-FETs $SPD_2$ and $SPG_2$. The P-FET $SPU_1$ has the fin structure 116 and the gate structure 124. The fin structure 116 includes a body region, a source region, a drain region and a channel region to be described exemplarily in FIG. 4. The N-FET $SPD_1$ has the fin structure 118 and the gate structure 124 extended from the P-FET $SPU_1$. The N-FET $SPG_1$ has the fin structure 118 extended from the N-FET $SPD_1$ and the gate structure 126. The fin structure 118 includes a body region, a source region, a drain region and a channel region for the N-FET $SPD_1$ and a body region, a first source or drain region, a second source or drain region and a channel region for the N-FET $SPG_1$. The drain region for the N-FET $SPD_1$ and the first source or drain region for the N-FET $SPG_1$ are shared. Similar to the P-FET $SPU_1$, the P-FET $SPU_2$ has the fin structure 120 and the gate structure 128. Similar to the N-FET $SPD_1$, the N-FET $SPD_2$ has the fin structure 122 and the gate structure 128 extended from the P-FET $SPU_2$. Similar to the N-FET $SPG_1$, the N-FET $SPG_2$ has the fin structure 122 extended from the N-FET $SPD_2$ and the gate structure 130.

The contact 132 is in contact with the source region of the P-FET $SPU_1$. The via 156 is formed over and coupled to the contact 132. The higher power supply node CVdd (labeled in FIG. 2) is coupled to the via 156 that in turn is coupled to the contact 132. The contact 134 is in contact with the drain region of the P-FET $SPU_1$ and the drain region of the N-FET $SPD_1$ shared with the first source or drain region of the N-FET $SPG_1$. The contact 134 is coupled to the contact 140 which is in contact with the gate structure 128 of the P-FET $SPU_2$ and the N-FET $SPD_2$. The storage node SSN (labeled in FIG. 2) includes the contact 134 coupled to the contact 140. The contact 136 is in contact with the source region of the N-FET $SPD_1$. The via 158 is formed over and coupled to the contact 136. The lower power supply node CVss (labeled in FIG. 2) is coupled to the via 158 that in turn is coupled to the contact 136. The contact 138 is in contact with a second source or drain region of the N-FET $SPG_1$. The via 162 is formed over and coupled to the contact 138. The bit line SBL is coupled to the via 162 that in turn is coupled to the contact 138. The contact 142 is in contact with the gate structure 126 of the N-FET $SPG_1$. The via 160 is formed over and coupled to the contact 142. The word line SWL is coupled to the via 160 that in turn is coupled to the contact 142.

The contact 144 is in contact with the source region of the P-FET SPU$_2$. The via 164 is formed over and coupled to the contact 144. The higher power supply node CVdd (labeled in FIG. 2) is coupled to the via 164 that in turn is coupled to the contact 144. The contact 146 is in contact with the drain region of the P-FET SPU$_2$ and the drain region of the N-FET SPD$_2$ shared with the first source or drain region of the N-FET SPG$_2$. The contact 146 is coupled to the contact 152 which is in contact with the gate structure 124 of the P-FET SPU$_1$ and the N-FET SPD$_1$. The complementary storage node SSNB (labeled in FIG. 2) includes the contact 146 coupled to the contact 152. The contact 148 is in contact with the source region of the N-FET SPD$_2$. The via 166 is formed over and coupled to the contact 148. The lower power supply node CVss (labeled in FIG. 2) is coupled to the via 166 that in turn is coupled to the contact 148. The contact 150 is in contact with a second source or drain region of the N-FET SPG$_2$. The via 170 is formed over and coupled to the contact 150. The complementary bit line SBLB is coupled to the via 170 that in turn is coupled to the contact 150. The contact 154 is in contact with the gate structure 130 of the N-FET SPG$_2$. The via 168 is formed over and coupled to the contact 154. The word line SWL is coupled to the via 168 that in turn is coupled to the contact 154.

Figure 5:
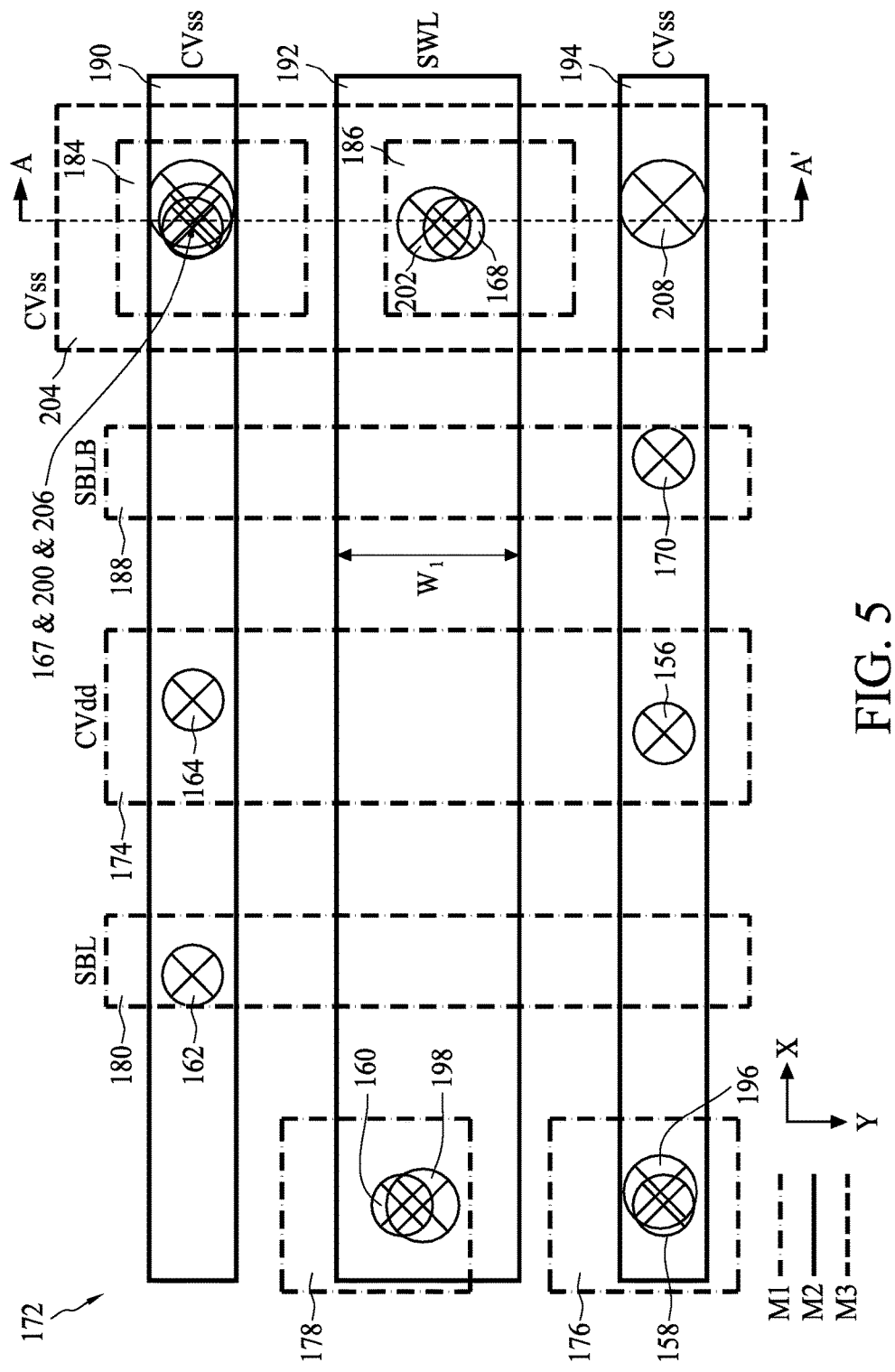
FIG. 5 is a schematic layout diagram of a back-end of line (BEOL) portion of the cell in FIG. 2 in accordance with some embodiments.

In some embodiments, the vias 162, 164 and 166 are aligned substantially along the X direction; the vias 166 and 168 are aligned substantially along the Y direction; the vias 170, 156 and 158 are aligned substantially along the X direction; and the vias 158 and 160 are aligned substantially along the Y direction. A distance between a middle line of the via 158 and a middle line of the via 166 is determined to be a cell pitch CP1$_x$ along the X direction. A distance between a middle line of the via 162 and a middle line of the via 170 is determined to be a cell pitch CP1$_y$ along the Y direction. In some embodiments, the cell pitch CP1$_x$ may larger than the cell pitch CP1$_y$. For example, according to the arrangement in FIG. 3, there are four fins (i.e., 116, 118, 120, 122) are disposed along the X direction, and there are two gate structures (i.e., 124 and 126, or 128 and 130) are disposed along the Y direction. Therefore, a ratio between the cell pitch CP1$_x$ and the cell pitch CP1$_y$ may be about 2. According to this arrangement of the transistors in the layout diagram 112, a metal line 180 for the bit line SBL and a metal line 188 for the complementary bit line SBLB to be described with reference to FIG. 5 are shorter than a metal line 192 for the word line SWL to be described with reference to FIG. 5, to reduce the capacitance on the bit line SBL and the capacitance on the complementary bit line SBLB. By further adopting the strategy of increasing a thickness of the metal line 192 for the word line WL to be described with reference to FIG. 6, the resistance of the word line SWL is decreased.

Figure 4:
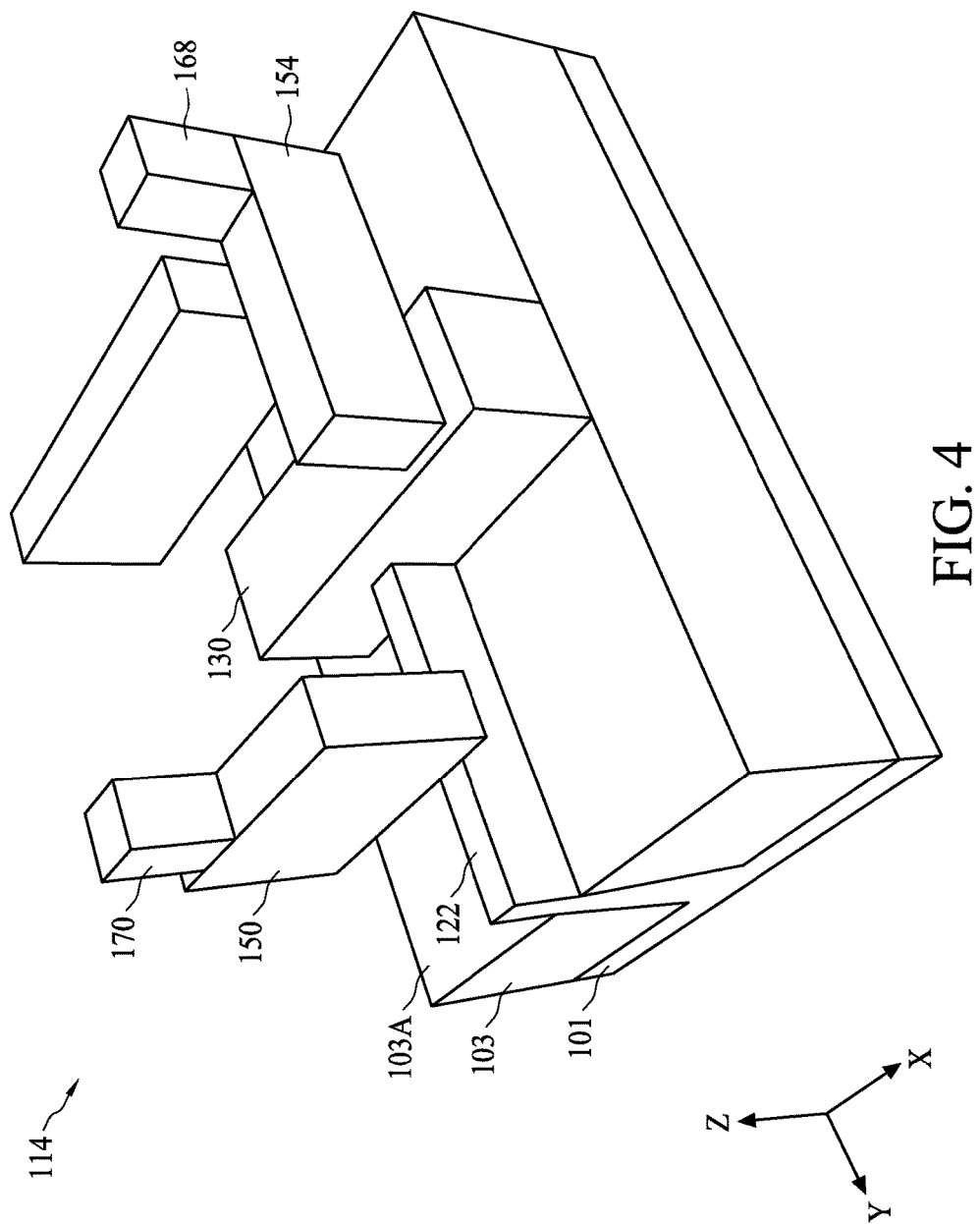
FIG. 4 is a schematic perspective diagram of a portion in the layout diagram in FIG. 3 in accordance with some embodiments.

FIG. 4 is a schematic perspective diagram of a portion 114 in the layout diagram 112 in FIG. 3 in accordance with some embodiments. FIG. 4 illustrates a perspective diagram of the N-FET SPG$_2$ implemented as a single-finned FinFET and positions of the different layers in the layout diagram 112 along a Z direction. Other transistors in the layout diagram 112 have corresponding components arranged in the Z direction in a similar manner as the N-FET SPG$_2$. The fin structure 122 extends along the Z direction from a substrate 101 and is surrounded by dielectric isolation structures 103. The fin structure 122 extends above top surfaces 103A of the dielectric isolation structures 103. The gate structure 130 is formed on the top surfaces 103A, traverses the fin structure 122 and wraps around the channel region of fin structure 122 extended above the top surfaces 103A. The first source or drain region and the second source or drain region of the N-FET SPG$_2$ are located in the fin structure 122 on opposite sides of the gate structure 130. In the fin structure 122, a region other than the channel region, the first source or drain region and the second source or drain region is the body region. In some embodiments, for an N-FET, the channel region and the body region are doped with p-type dopants such as boron (B) and the source region and the drain region are doped with n-type dopants such as arsenic (As) and phosphorous (P). In some embodiments, for a P-FET, the channel region and the body region are doped with n-type dopants, and the source region and the drain region are doped with p-type dopants. The source or drain contact 150 is formed over and in contact with the second source or drain region of the fin structure 122. The via 170 is formed over and coupled to the contact 150. The gate contact 154 is formed over and in contact with the gate structure 130. The via 168 is formed over and connected to the contact 154.

FIG. 5 is a top view of a schematic layout diagram 172 of the cell SC in FIG. 2 in accordance with some embodiments. The schematic layout diagram 172 includes stacked metal layers and vias interposed between the metal layers of the cell SC in FIG. 2. The schematic layout diagram 172 may be the BEOL portion of the cell SC. The formation of the via0 layer under the metal layer M1 is considered the beginning of the BEOL portion of the IC fabrication. FIG. 5 illustrates positions and/or orientations of metal lines and landing pads in the metal layers M1 to M3, and vias between the layers. In FIG. 5, metal lines 190 and 194 are located in the same layer as and on opposite sides of a metal line 192 for the word line SWL.

The layout diagram 172 includes a plurality of metal lines 174, 180 and 188 and a plurality of landing pads 176, 178, 184 and 186 in a metal layer M1, a plurality of metal lines 190, 192 and 194 in a metal layer M2, a metal line 204 in a metal layer M3, the plurality of vias 156, 158, 160, 162, 164, 166 (not labeled), 168 and 170 in the via0 layer, a plurality of vias 196, 198, 200 (not labeled) and 202 in the via1 layer and a plurality of vias 206 (not labeled) and 208 in the via2 layer. The vias 166, 200, and 206 are overlapped in the layout diagram 172 and are distinctly shown in a cross-sectional diagram 182 to be described with reference to FIG. 6. The metal lines 174, 180 and 188 in the metal layer M1 extend substantially along the Y direction. The metal lines 190, 192 and 194 in the metal layer M2 extend substantially along the X direction and the metal line 204 in the metal layer M3 extends substantially along the Y direction.

The metal line 174 is formed over and coupled to the via 156 and the via 164. The higher power supply node CVdd of the cell SC (shown in FIG. 2) includes a portion of the metal line 174. The metal line 174 extends at least across the second dimension of the layout of the array of cells SC$_{11}$, SC$_{12}$, . . . and SC$_{84}$ in the SRAM macro 100 (shown in FIG. 1). For example, the higher power supply node CVdd of the cell SC includes the portion of the metal line 174 that extends across the cell pitch CP1$_y$. For another example, the higher power supply node CVdd of the cell SC includes the portion of the metal line 174 that extends between the outermost boundaries of the metal lines 190 and 194 in the Y direction. Other nodes of the cell SC including portions of metal lines running substantially along the X direction have similarly defined boundaries as the portion of the metal line 174 for the higher power supply node CVdd. The metal line 180 is formed over and coupled to the via 162. The bit line SBL includes a portion of the metal line 180. The metal line 188 is formed over and coupled to the via 170. The complementary bit line SBLB includes a portion of the metal line 188. The metal line 180 for the bit line SBL and the metal line 188 for the complementary bit line SBLB are arranged on opposite sides of the metal line 174 for the higher power supply node CVdd.

The metal line 192 is formed over and coupled to the via 160 through the via 198 and the landing pad 178, and is formed over and coupled to the via 168 through the via 202 and the landing pad 186. The word line SWL of the cell SC (shown in FIG. 2) includes the landing pad 178, the via 198, the landing pad 186, the via 202 and a portion of the metal line 192. The metal line 192 extends at least across the first dimension of the layout of the array of cells $SC_{11}$, $SC_{12}$, ... and $SC_{84}$ of the SRAM macro 100 (shown in FIG. 1). For example, the word line SWL of the cell includes the portion of the metal line 192 that extends across the cell pitch $CP1_x$. For another example, the word line SWL of the cell SC includes the portion of the metal line 192 that extends between the outermost boundaries of the landing pads 178 and 186 in the X direction. Other nodes of the cell SC including portions of metal lines running substantially along the X direction have similarly defined boundaries as the portion of the metal line 192 for the word line SWL. The metal line 194 is formed over and coupled to the via 158 through the via 196 and the landing pad 176. The metal line 190 is formed over and coupled to the via 166 through the via 200 and the landing pad 184. The metal line 204 is formed over and coupled to the metal line 190 through the via 206 and is formed over and coupled to the metal line 194 through the via 208. The lower power supply node CVss includes the landing pad 176, the via 196, a portion of the metal line 194, the landing pad 184, the via 200, a portion of the metal line 190, the via 206, the via 208 and a portion of the metal line 204. The metal line 190 and the metal line 194 for the lower power supply node CVss are arranged on opposite sides of the metal line 192 for the word line SWL. In some embodiments, the metal line 204 also serves as a line in a power mesh.

Since the metal line 180 for the bit line SBL couples the second source or drains of the N-FETs $SPG_1$ of a column of cells such as the column of cells $SC_{11}$, $SC_{21}$, ... and $SC_{81}$ (shown in FIG. 1) together, the metal line 180 is running substantially along the Y direction. In some embodiments, the metal layer M1 is the closest metal layer to the fin structure 118 (shown in FIG. 3) of the N-FET $SPG_1$ in which metal lines are running substantially along the Y direction. Further, the closest metal layer to the fin structure 118 is chosen to reduce the capacitance on the bit line SBL. Therefore, the metal line 180 for the bit line SBL is arranged in the metal layer M1. Similarly, the metal line 188 for the complementary bit line SBLB is arranged in the metal layer M1. In addition, because the metal line 192 for the word line SWL couples the gates of the N-FETs $SPG_1$ and $SPG_2$ of a row of cells such as the row of cells $SC_{11}$, $SC_{12}$, ... and $SC_{14}$ together, the metal line 192 is running substantially along the X direction. In some embodiments, the metal layer M2 is the closest metal layer to the gate structure 126 (shown in FIG. 3) of the N-FET $SPG_1$ and the gate structure 130 of the N-FET $SPG_2$ in which metal lines are running substantially along the X direction. Further, the closest metal layer to the gate structures 126 and 130 are chosen to reduce resistance of the word line SWL. Hence, the metal line 192 for the word line SWL is arranged in the metal layer M2.

Figure 6:
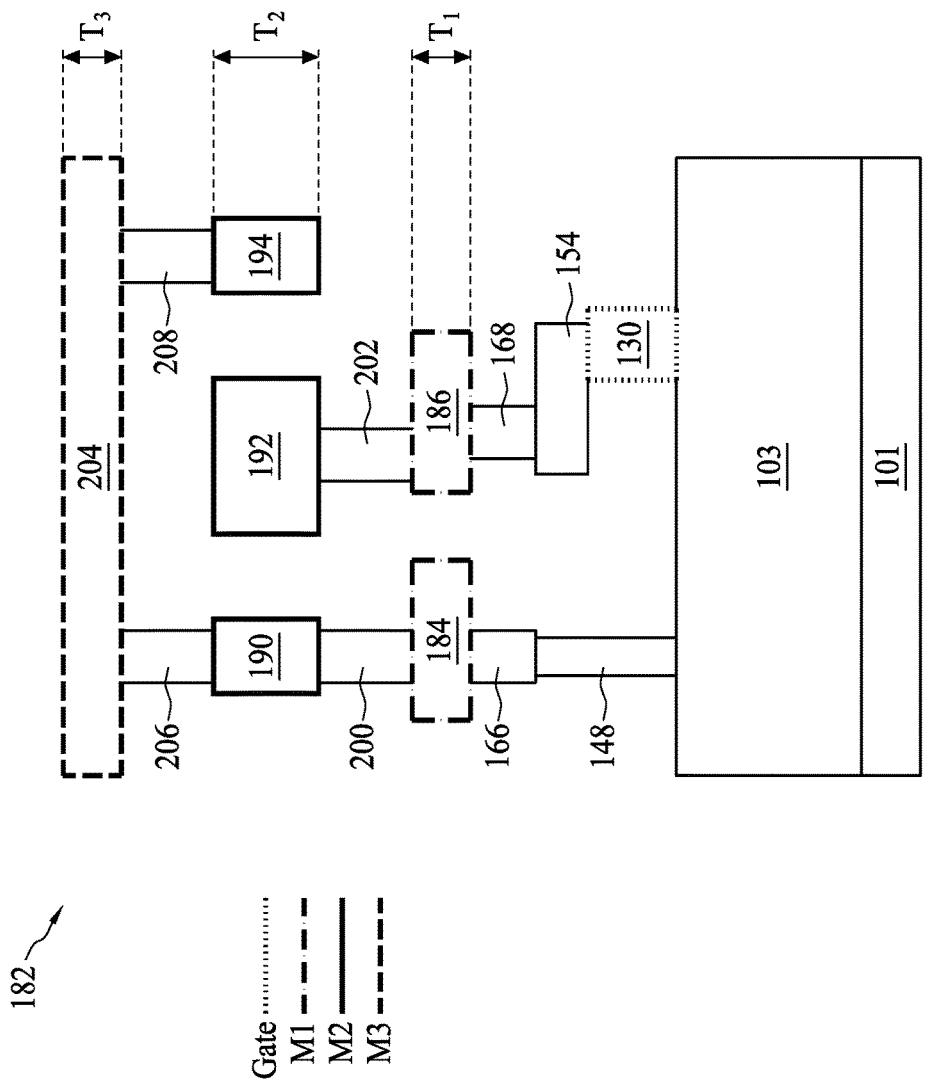
FIG. 6 is a schematic cross-sectional diagram taken along line A-A' in FIG. 5 in accordance with some embodiments.

FIG. 6 is a schematic cross-sectional diagram 182 of the cell SC in FIG. 2 in accordance with some embodiments. The cross-sectional diagram 182 includes a cross-section of the BEOL portion taken along line A-A' in FIG. 5 and a cross-section of the FEOL portion correspondingly taken along line A-A' in FIG. 3. FIG. 6 illustrates the metal layer M2 having a thickness $T_2$ larger than a thickness $T_1$ of the metal layer M1 and a thickness $T_3$ of the metal layer M3 by a factor.

To reduce the resistance of the word line SWL, the thickness $T_2$ of the metal line 192 in the metal layer M2 is increased. In addition, to limit the capacitance on the metal line 180 for the bit line SBL and the capacitance on the metal line 188 for the complementary bit line SBLB, the thickness $T_1$ of the metal layer M1 is reduced or kept the same as a default value for a technology node. In some embodiments, a lower limit of the factor by which the thickness $T_2$ is larger than the thickness $T_1$ and $T_3$ is dependent on a resistance of the word line SWL such that speed performance of the cell SC is not degraded as technology advances. In some embodiments, when the resistance of the word line SWL is kept substantially constant as technology advances to another generation, the thickness $T_2$ is determined to compensate the increase in resistance due to advancement of technology. In other embodiments, when a unit length resistance of the word line SWL is kept substantially constant as technology advances, the thickness $T_2$ is determined to compensate the increase in unit length resistance due to technology advances.

In some embodiments, the upper limit of the factor is dependent on a maximum metal pitch and the maximum depth of the metal trench. For example, a thickness of the metal layer is determined in relation to a metal pitch of the metal layer. Because side walls of trenches in which metal such as copper is deposited to form metal lines are downward tapered, enough spacing between adjacent trenches is arranged with respect to the depth of the trenches to prevent bridging of the metal lines at the top of the trenches. Therefore, enough metal pitch is arranged with respect to the thickness of the metal lines. In addition, the depth of the trenches is also limited so that voids are not formed when copper is deposited in the trenches. Therefore, in some embodiments, the upper limit of the factor by which the thickness $T_2$ is larger than the thickness $T_1$ and $T_3$ is dependent on a maximum metal pitch obtained for the metal layer during routing and the maximum depth of the trench for depositing, for example, copper without forming voids.

In some embodiments, the cross-sectional diagram 182 includes the FEOL portion and the BEOL portion. The FEOL portion includes the substrate 101, the dielectric isolation structure 103, the gate structure 130, the source contact 148 and the gate contact 154. The dielectric isolation structure 103 is formed over the substrate 101. The gate structure 130 is formed over the dielectric isolation structure 103. The source contact 148 is formed over the dielectric isolation structure 103. The gate contact 154 is formed over and in contact with the gate structure 130. The BEOL portion includes a structure of stacked metal layers. The stacked metal layers includes the metal lines 184 and 186 in the metal layer M1, the metal lines 190, 192 and 194 in the metal layer M2, the metal line 204 in the metal layer M3, vias 166 and 168 in the via0 layer, vias 200 and 202 in the via1 layer and vias 206 and 208 in the via2 layer. The via0 layer, metal layer M1, via1 layer, metal layer M2, via2 layer and metal layer M3 are stacked in order.

In some embodiments, the thickness $T_2$ of the metal layer M2 is larger than the thickness $T_1$ of the metal layer M1 immediately below the metal layer M2 and the thickness $T_3$ of the metal layer M3 immediately above the metal layer M2 by the factor equal to at least about 15%. In some embodiments, the term "about" used herein indicates greater than or less than the stated value by a percentage such as 5%, 10%, 15%, etc. of the stated value. In other embodiments, the factor is equal to at least about 30%. In still other embodiments, the factor is equal to at least about 40%. In some embodiments, the value 15%, 30% or 40% is the lower limit of the factor. Embodiments for determining the lower limit and the upper limit of the factor have been provided above with reference to FIG. 6. As described with reference to FIG. 1, when the number of columns of the array of cells $S_{11}$, $S_{12}$ . . . and $S_{84}$ is increased, the word line $SWL_1$, $SWL_2$ . . . or $SWL_8$ (representatively denoted as SWL) is lengthened, causing resistance of the word line SWL to be increased. The metal line 192 for the word line SWL runs along the row of cells $SC_{11}$ to $SC_{14}$, $SC_{21}$ to $SC_{24}$, . . . or $SC_{81}$ to $SC_{84}$. By increasing the thickness $T_2$ of the metal line 192 for the word line SWL, the resistance of the word line SWL is decreased, thereby improving speed performance of the SRAM macro 100.

In addition, as described with reference to FIG. 1, when the number of rows is increased, the pair of bit line and complementary bit line $SBL_1$ and $SBLB_1$, $SBL_2$ and $SBLB_2$, . . . or $SBL_4$ and $SBLB_4$ (representatively denoted as SBL and SBLB) are lengthened, resulting in capacitance on the bit line SBL and capacitance on the complementary bit line SBLB to be increased. By making the thickness $T_1$ of the metal layer M1 to be substantially smaller than the thickness $T_2$ of the metal layer M2 such as by the factor equal to at least about 15%, 30% or 40%, the capacitance on the bit line SBL and the capacitance on the complementary bit line SBLB is limited, thereby limiting the capacitive loads asserted on the bit line SBL and the complementary bit line SBLB that adversely impacts the delay for sensing or writing data. Furthermore, the limited capacitance on the bit line SBL and the capacitance on the complementary bit line SBLB may improve cell stability and data sensing margin.

Figure 7:
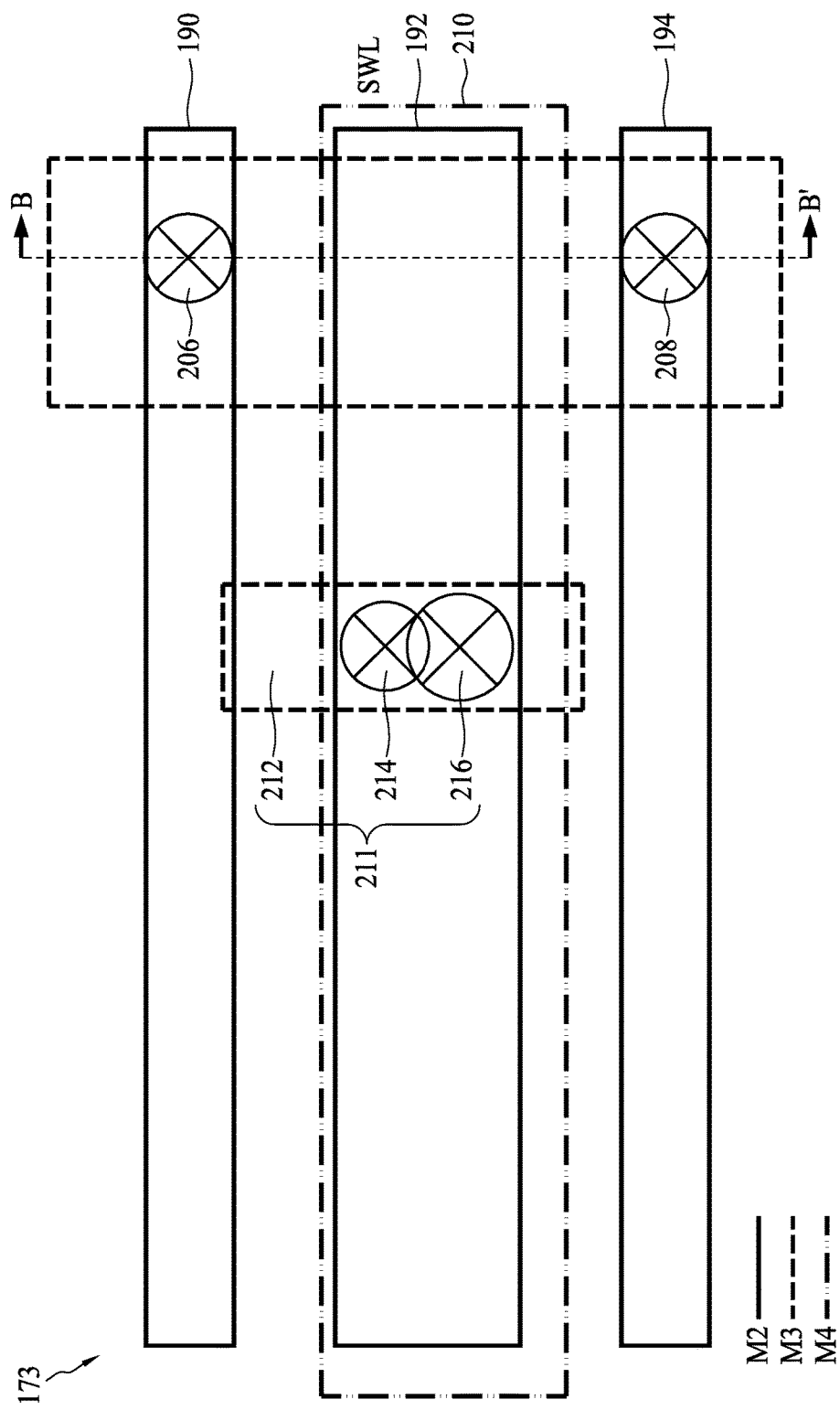
FIG. 7 is a schematic layout diagram of a BEOL portion of the cell in FIG. 2 in accordance with other embodiments.
Figure 8:
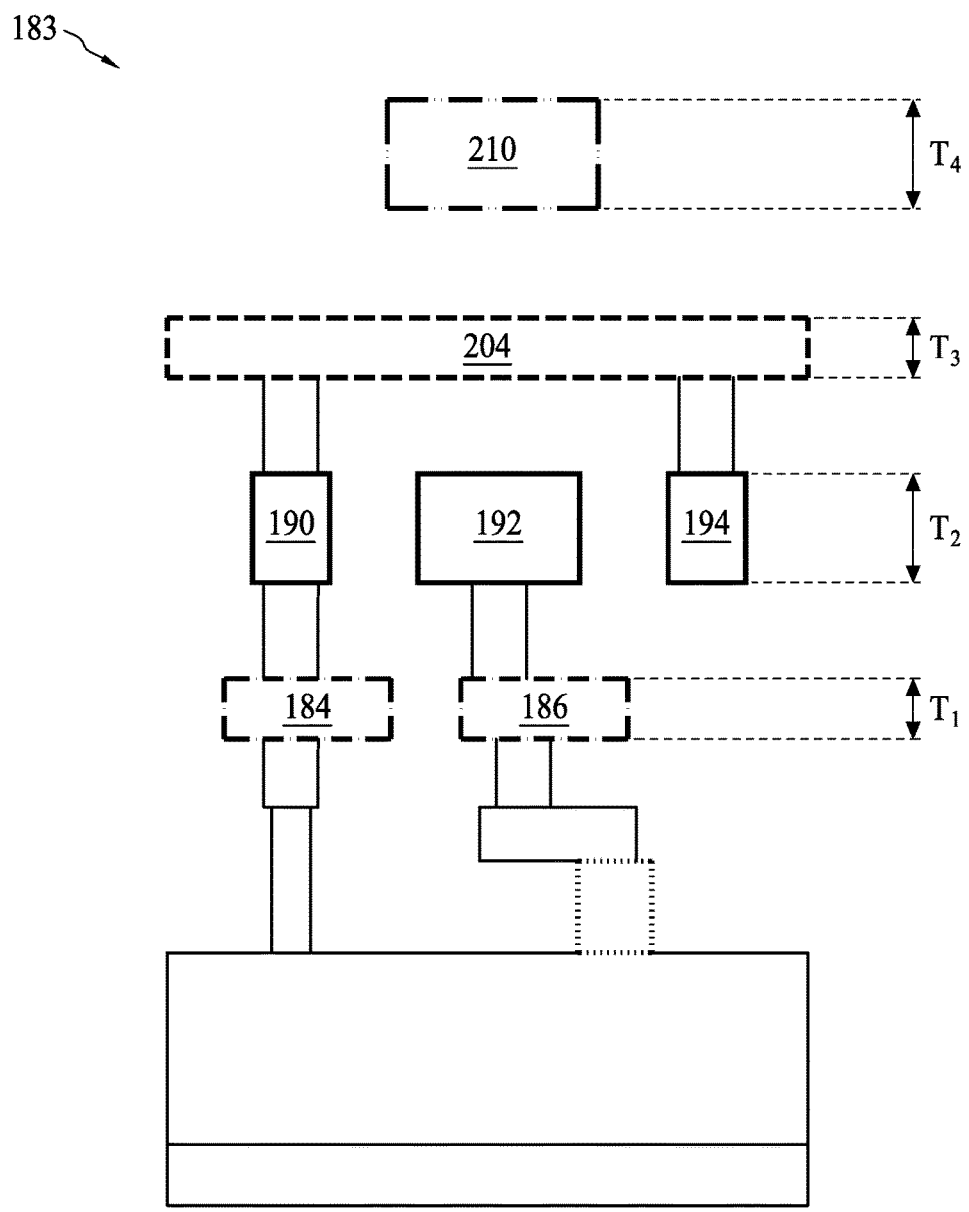
FIG. 8 is a schematic cross-sectional diagram taken along line B-B' in FIG. 7 in accordance with other embodiments.

Furthermore, by making the thickness $T_1$ of the metal layer M1 and the thickness $T_3$ of the metal layer M3 to be substantially smaller than the thickness $T_2$ of the metal layer M2, a metal pitch of the metal layer M1 is smaller than that of the metal layer M2 and a metal pitch of the metal layer M3 is smaller than that of the metal layer M2, thereby increasing routing density in the metal layer M1 and the metal layer M3. In some embodiments, with sufficiently increased thickness $T_2$ such as by at least about 30% or 40% more than the thicknesses $T_1$ and $T_3$, the resistance of the metal line 192 is reduced. For example, the reduced resistance is enough to compensate for the increase in resistance as technology advances. Therefore, further enhancement of the resistance by coupling the metal line 192 to a parallel running metal line in another metal layer such as the metal line 210 in a metal layer M4 shown in FIGS. 7 and 8 is not needed. For example, in FIG. 7 and FIG. 8, without the extra metal line 210 in the metal layer M4 to decrease the resistance of the word line SWL, a thickness of the metal layer M4 is decreased so that the corresponding metal pitch renders improvement in routing density in the metal layer M4. Furthermore, the extra metal line 210 running across a row of cells such as $SC_{1,1}$, $SC_{1,2}$ . . . and $SC_{1,4}$ in FIG. 1 is not formed in the metal layer M4. Hence, the spared routing tracks in the metal layer M4 and the intervening metal layer M3 for connecting the metal line 192 in the metal layer M2 to the metal line 210 in the metal layer M4 facilitate routing for other interconnections. Accordingly, the arrangement improves compactness and speed of a semiconductor chip including the SRAM macro 100 in FIG. 1.

FIG. 7 is a top view of a layout diagram 173 of the cell SC in FIG. 2 in accordance with other embodiments. The schematic layout diagram 173 may be the BEOL portion of the cell SC. Compared to the layout diagram 172 in FIG. 5, the layout diagram 173 further includes the metal line 210 in the metal layer M4 extending in parallel to the metal line 192 in the metal layer M2, and a metal strap structure 211 that couples the metal line 192 and the metal line 210 together. Therefore, the word line SWL further includes the metal strap structure 211 and a portion of the metal line 210. The metal strap structure 211 includes a landing pad 212 in the metal layer M3, a via 214 in the via2 layer between the metal line 192 and the landing pad 212 and a via 216 in a via3 layer between the landing pad 212 and the metal line 210. For simplicity, the via0 layer, the metal layer M1 and the via1 layer are not shown in FIG. 7.

FIG. 8 is a schematic cross-sectional diagram 183 taken along line B-B' in FIG. 7 in accordance with other embodiments. Compared to the cross-sectional diagram 182 in FIG. 6, the cross-sectional diagram 183 further includes the metal line 210 in the metal layer M4. In some embodiments, the thickness $T_2$ of the metal line 192 is larger than the thickness $T_1$ and the thickness $T_3$ by a first factor and/or a thickness $T_4$ of the metal line 210 is larger than the thickness $T_3$ and a thickness $T_5$ of a metal layer M5 (not shown) by a second factor. In some embodiments, the first factor is equal to at least about 15%, 30% or 40%. In some embodiments, the second factor is substantially equal to the first factor. As technology further advances such as by two or more generations, for example, further resistance reduction in addition to increasing the thickness $T_2$ by the first factor may be used to compensate for the increase in the resistance of the word line SWL. For another example, when the thickened $T_4$ of the metal layer 210 is extended in parallel and coupled to the metal line 192, the resistance of the word line SWL is further decreased. Furthermore, in some embodiments, because an upper metal layer such as the metal layer M4 is typically less densely populated with wires than a lower metal layer such as the metal layer M2, a metal pitch for the metal layer M4 is usually larger than that of the metal layer M2. Therefore, in some embodiments, the second factor is larger than the first factor by at least about 10%. In still other embodiments, the second factor is larger than the first factor by about 20%. The upper limit and the lower limit for the second factor is determined similarly as the first factor described with reference to FIG. 6. In some embodiments, the thickness $T_4$ of the metal layer M4 is substantially larger than or equal to the thickness $T_2$ of the metal layer M2 for power mesh purpose. A power mesh includes several metal layers. Each metal layer includes power lines or power rails running, for example, horizontally or vertically. The metal layers are stacked such that any adjacent metal layers have the power lines or power rails running, for example, in orthogonal directions. A mean time to failure (MTTF) of a metal line serving as a power line or a power rail, when estimated taking electromigration into consideration, decreases with the increase of current density. Therefore, in some embodiments, the thickness $T_4$ of the metal layer M4 is increased to increase the MTTF of the power lines in the metal layer M4. For example, the metal layer M4 includes a metal line coupled to the metal line 204 for the purpose of a CVss power mesh.

In some embodiments, the terms "substantially equal to" and "substantially greater than" used herein for a first number and a second number refer correspondingly to the first number differing from the second number and the first number exceeding the second number by a percentage such as 5%, 10%, 15%, etc. of an average of the first number and the second number. Other ways to determine the first number being "substantially equal to" or "substantially greater than" the second number are within the contemplated scope of the present disclosure. For example, for "substantially equal to", a ratio of the first number to the second number is between percentages such as 85% to 100%, 90% to 100% and 95% to 100%, etc. For "substantially greater than", a ratio of the first number to the second number is greater than a percentage such as 105%, 110% and 115%, etc.

The foregoing outlines features of SRAM cell with metal lines for lower power supply node on opposite sides of word line so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Figure 9:
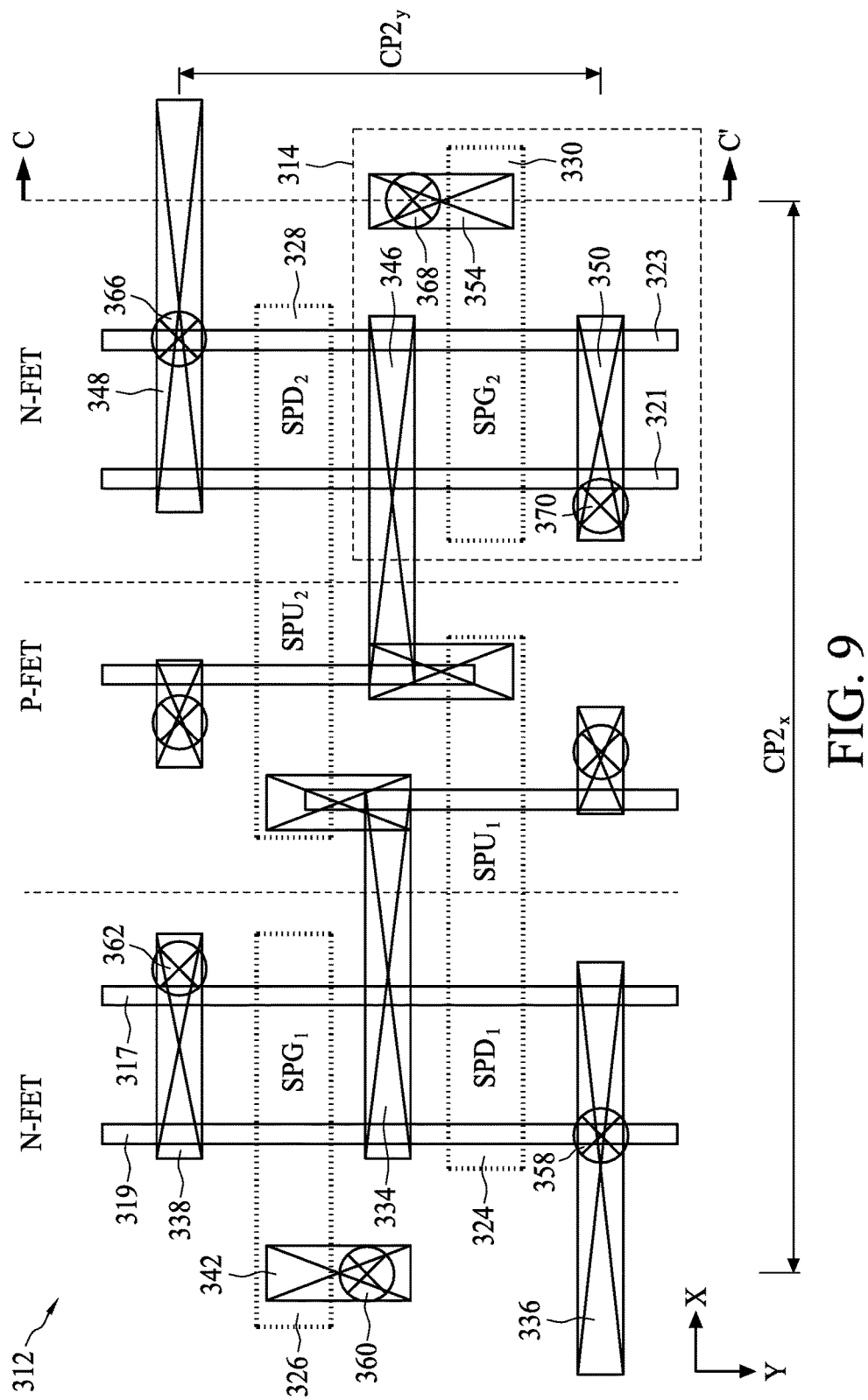
FIG. 9 is a schematic layout diagram of an FEOL and via0 layer portion of the cell in FIG. 2 in accordance with other embodiments.

SRAM Cell with Metal Lines for Lower Power Supply Node on Opposite Sides of Pair of Bit Line and Complementary Bit Line FIG. 9 is a top view of a schematic layout diagram 312 of the cell SC in FIG. 2 in accordance with other embodiments. The schematic layout diagram 312 may be an FEOL and via0 layer of the cell SC. Compared to the layout diagram 112 in FIG. 3 in which the N-FETs $SPG_1$ and $SPD_1$ and the NFETs $SPG_2$ and $SPD_2$ are single-finned, the N-FETs $SPG_1$ and $SPD_1$ and the N-FETs $SPG_2$ and $SPD_2$ in the layout diagram 312 are double-finned to enhance the speed for enabling the cell SC for access. However, this is not a limitation of the present disclosure. The N-FETs $SPG_1$ and $SPD_1$ and the N-FETs $SPG_2$ and $SPD_2$ may be any multiple-finned structure in another embodiment.

In the layout diagram 312, the N-FET $SPG_1$ has fin structures 317 and 319 and a gate structure 326 that traverses both the fin structures 317 and 319. The gate structure 326 corresponds to the gate structure 126 in FIG. 3. The fin structures 317 and 319 correspond to the fin structure 118 in FIG. 3. Both the fin structures 317 and 319 include body regions, first source or drain regions, second source or drain regions and channel regions for the N-FET $SPG_1$, which collectively serve as a body region, a first source or drain region, a second source or drain region and a channel region of the N-FET $SPG_1$. A contact 338 extends across and is coupled to the second source or drain regions for the N-FET $SPG_1$ in both the fin structures 317 and 319. The contact 338 corresponds to the contact 138 in FIG. 3. A via 362 in the via0 layer is formed over and coupled to the contact 338. The via 362 corresponds to the via 162 in FIG. 3. A contact 334 extends across and is coupled to the first source or drain regions for the N-FET $SPG_1$ in both the fin structures 317 and 319. The contact 334 corresponds to the contact 134 in FIG. 3.

The N-FET $SPD_1$ has the fin structures 317 and 319 extended from the N-FET $SPG_1$ and a gate structure 324 that traverses both the fin structures 317 and 319. The gate structure 324 corresponds to the gate structure 124 in FIG. 3. Both the fin structures 317 and 319 include body regions, source regions, drain regions and channel regions for the N-FET $SPD_1$, which collectively serve as a body region, a source region, a drain region and a channel region of the N-FET $SPD_1$. The first source or drain region of the N-FET $SPG_1$ and the drain region of the N-FET $SPD_1$ are shared. The contact 334 is also shared between the N-FET $SPG_1$ and the N-FET $SPD_1$. The contact 334 corresponds to the contact 134 in FIG. 3. A contact 336 extends across and is coupled to the source regions for the N-FET $SPD_1$ in both the fin structures 317 and 319. The contact 336 corresponds to the contact 136 in FIG. 3. A via 358 in the via0 layer is formed over and coupled to the contact 336. The via 358 corresponds to the via 158 in FIG. 3.

Similar to the N-FET $SPG_1$ that has the fin structures 317 and 319, the gate structure 326, the contacts 338 and 334 and the via 362, the N-FET $SPG_2$ has fin structures 321 and 323, a gate structure 330, contacts 350 and 346 and the via 370. The gate structure 330, contacts 350 and 346 and via 370 correspond to the corresponding gate structure 130, contacts 150 and 146 and via 170 in FIG. 3. Similar to the N-FET $SPD_1$ that has the fin structures 317 and 319, the gate structure 324, the contacts 336 and 334 and the via 358, the N-FET $SPD_2$ has the fin structures 321 and 323, a gate structure 328, contacts 348 and 346 and a via 366. The gate structure 328, contacts 348 and 346 and via 366 correspond to the corresponding gate structure 128, contacts 148 and 146 and via 166 in FIG. 3. Structural elements for the P-FETs $SPU_1$ and $SPU_2$ in FIG. 9 are substantially the same as those for the P-FETs $SPU_1$ and $SPU_2$ in FIG. 3 and are therefore not labeled in FIG. 9.

Due to the double-finned configuration in the layout diagram 312, a cell pitch $CP2_x$ along the X direction is wider than the cell pitch $CP1_x$ of the layout diagram 112. A contact 342 in contact with the gate structure 326 and a contact 354 in contact with the gate structure 330 are pushed outward of the layout diagram 312 compared to the contact 142 and the contact 154 in the layout diagram 112. Therefore, a via 360 formed over and coupled to the contact 342 and a via 368 formed over and coupled to the contact 354 are also pushed outward. The cell pitch $CP2_x$ determined to be a distance between a middle line of the via 360 and a middle line of the via 368 is therefore widened. In some embodiments, a cell pitch $CP2_y$ along the Y direction, determined to be a distance between a middle line of the via 366 and a middle line of the via 370, is substantially the same as the cell pitch $CP1_y$ of the layout diagram 112. In some embodiments, the cell pitch $CP2_x$ may larger than the cell pitch $CP2_y$. For example, according to the arrangement in FIG. 9, there are six fins are disposed along the X direction, and there are two gate structures are disposed along the Y direction. Therefore, a ratio between the cell pitch $CP2_x$ and the cell pitch $CP2_y$ may larger than 2, e.g., 2.5. In some embodiments, a ratio of the cell pitch $CP2_x$ to $CP1_x$ is greater than 1.15. For illustration purposes, the number of fin structures for the N-FETs $SPG_1$ and $SPD_1$ or the N-FETs $SPG_2$ and $SPD_2$ are two. The number of fin structures for the P-FETs $SPU_1$ and $SPU_2$ is one. Other number of fin structures for the N-FETs $SPG_1$ and $SPD_1$ or N-FETs $SPG_2$ and $SPD_2$, and other number of fin structures for the P-FETs $SPU_1$ and $SPU_2$ are within the contemplated scope of the present disclosure. The above-mentioned ratio of the cell pitches $CP1_x$ to $CP1_y$, ratio of the cell pitches $CP2_x$ to $CP2_y$, and the ratio of the cell pitches $CP2_x$ to $CP1_x$ are for the purpose of description. This is not a limitation of the present disclosure. Other pitch ratios resulted from, for example, other number of fin structures and/or other number of gate structures are within the scope of the present disclosure.

Figure 10:
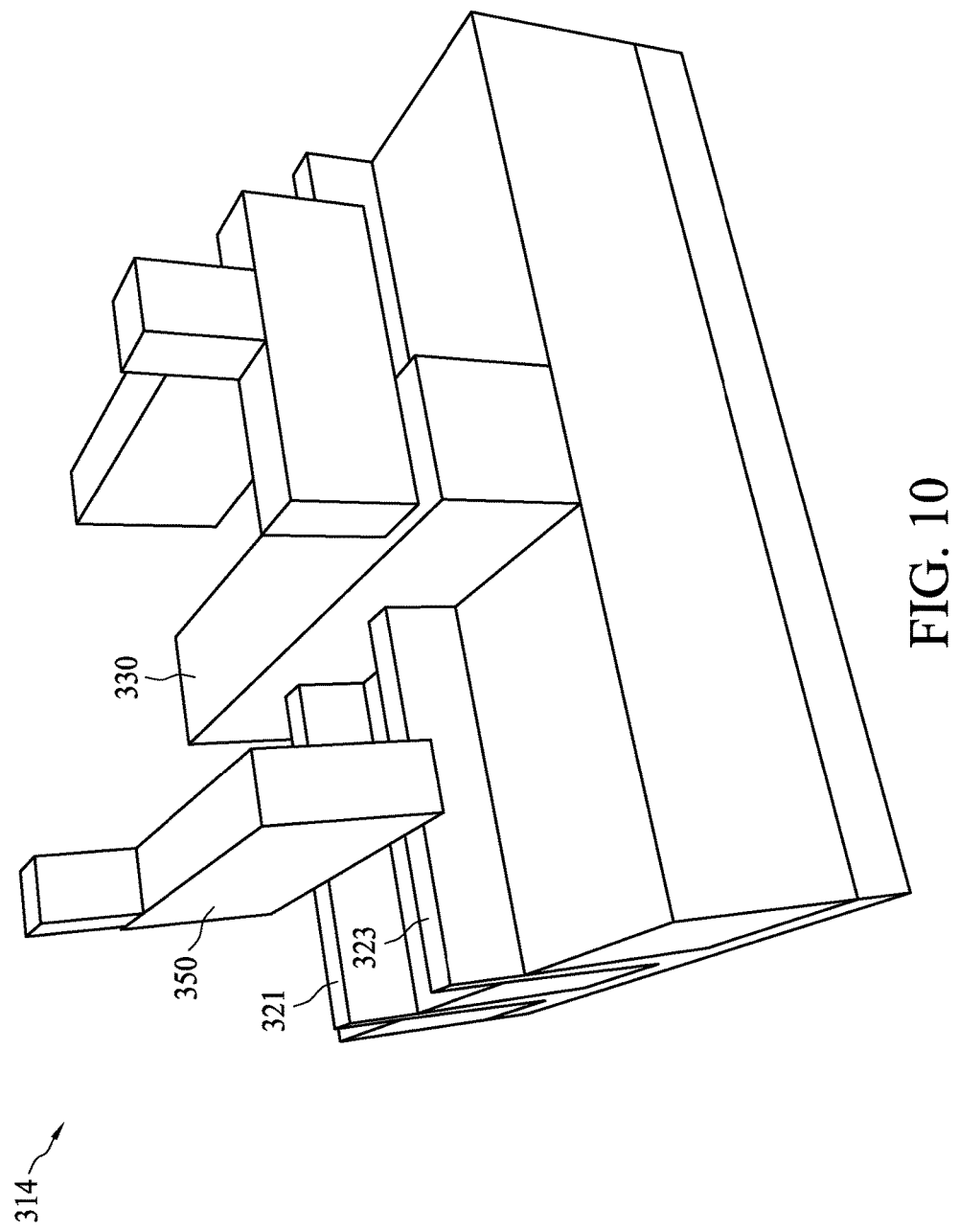
FIG. 10 is a schematic perspective diagram of a portion in the layout diagram in FIG. 9 in accordance with some embodiments.

FIG. 10 is a schematic perspective diagram of a portion 314 in the layout diagram 312 in FIG. 9 in accordance with some embodiments. Compared to the portion 114 in FIG. 4, the N-FET SPG$_2$ in the portion 314 is implemented as a double-finned FinFET. The N-FETs SPG$_1$, SPD$_1$ and SPD$_2$ in the layout diagram 312 have similar structures as that of the N-FET SPG$_2$ shown in FIG. 10. The P-FETs SPU$_1$ and SPU$_2$ in the layout diagram 312 have similar structures as that of the N-FET SPG$_2$ shown in FIG. 4. Each of the fin structures 321 and 323 is similar to the fin structure 122 in the FIG. 4. The gate structure 330 traverses the fin structures 321 and 323 and wraps around a corresponding channel region in each of the fin structures 321 and 323. The source or drain contact 350 is formed over and in contact with the second source or drain regions of both the fin structures 321 and 323.

Figure 11:
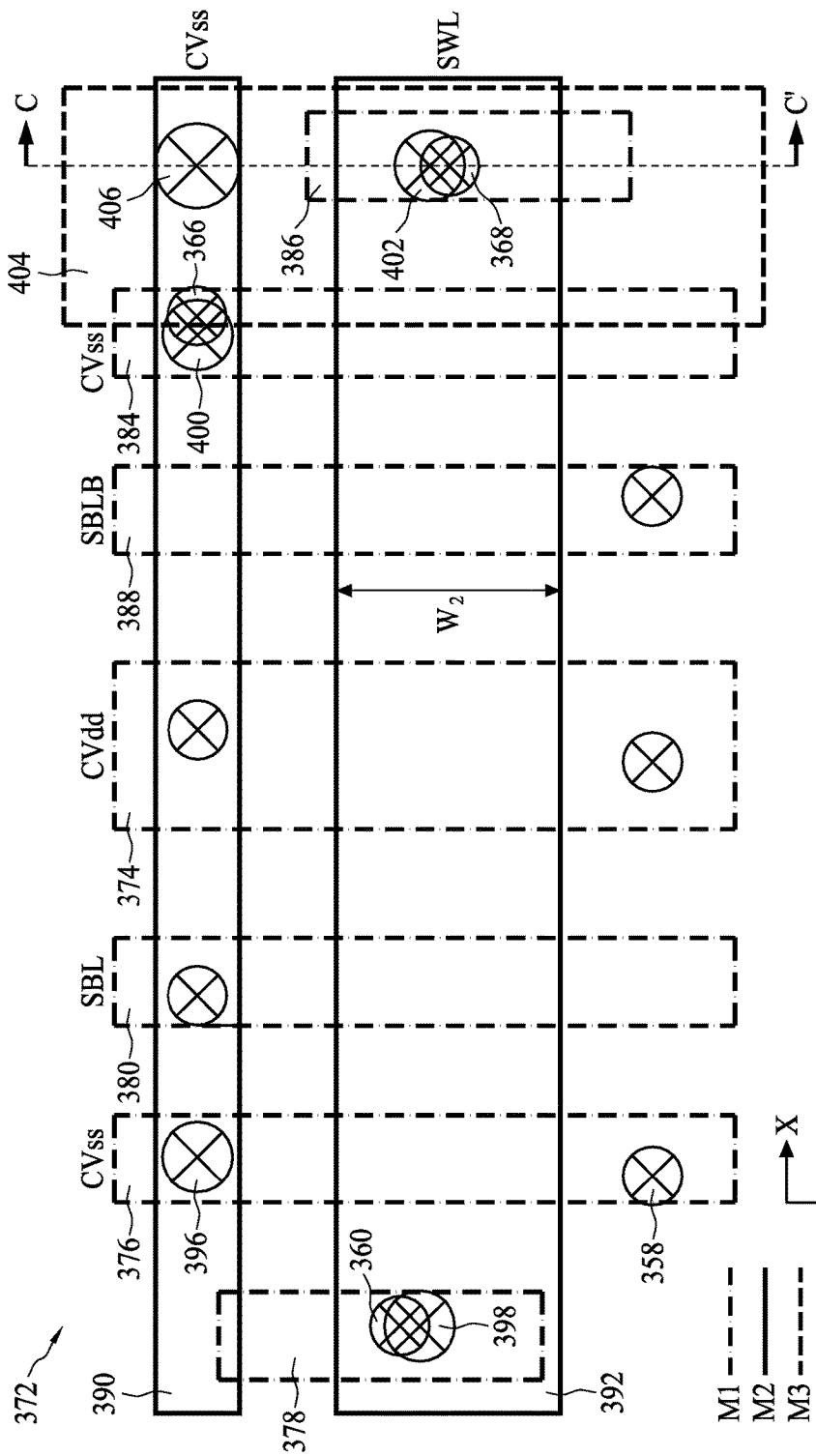
FIG. 11 is a schematic layout diagram of a BEOL portion of the cell in FIG. 2 in accordance with other embodiments.

FIG. 11 is a top view of a schematic layout diagram 372 of the cell SC in FIG. 2 in accordance with other embodiments. The schematic layout diagram 372 may be the BEOL portion of the cell SC. Compared to the layout diagram 172 in FIG. 5, the lower power supply node CVss (shown in FIG. 2) includes a portion of the metal line 376 and a portion of a metal line 384 in the same layer as and on opposite sides of a pair of metal lines 380 and 388 for the corresponding bit line SBL and complementary bit line SBLB.

The lower power supply node CVss includes the portion of a metal line 376 and the portion of a metal line 384 in the metal layer M1 running substantially along the Y direction, a via 396 and a via 400 in the via1 layer, a portion of a metal line 390 in the metal layer M2 running substantially along the X direction, a via 406 in the via2 layer and a portion of a metal line 404 in the metal layer M3 running substantially along the Y direction. The metal line 376 is formed over and coupled to the via 358. The metal line 376 corresponds to the landing pad 176 in FIG. 5. The via 358 corresponds to the via 158 in FIG. 5. The metal line 384 is formed over and coupled to the via 366. The metal line 384 corresponds to the landing pad 184 in FIG. 5. The via 366 corresponds to the via 166 in FIG. 5. The metal line 390 is formed over and coupled to the metal line 376 through the via 396 and formed over and coupled to the metal line 384 through the via 400. The metal line 390 corresponds to the metal line 190 in FIG. 5. The vias 396 and 400 correspond to the corresponding vias 196 and 200 in FIG. 5. The metal line 404 is formed over and coupled to the metal line 390 through the via 406. The metal line 404 corresponds to the metal line 204 in FIG. 5. The via 406 corresponds to the via 206 in FIG. 5. Furthermore, the word line SWL includes a landing pad 378 and a landing pad 386 in the metal layer M1, a via 398 and a via 402 in the via1 layer and a portion of a metal line 392 in the metal layer M2. The landing pad 378 is formed over and coupled to the via 360. The landing pad 378 corresponds to the landing pad 178 in FIG. 5. The via 360 corresponds to the via 160 in FIG. 5. The landing pad 386 is formed over and coupled to the via 368. The landing pad 386 corresponds to the landing pad 186 in FIG. 5. The via 368 corresponds to the via 168 in FIG. 5. The metal line 392 is formed over and coupled to the landing pads 378 and 386 through the corresponding via 398 and 402. The metal line 392 corresponds to the metal line 192 in FIG. 5. The vias 398 and 402 correspond to the corresponding vias 198 and 202 in FIG. 5.

In the metal layer M1, the metal lines 376 and 384 are located on opposite sides of the metal line 380 and the metal line 388 for forming the corresponding bit line and complementary bit line SBL and SBLB. In between the metal line 380 and 388, a metal line 374 for forming the higher power supply node CVdd resides. With respect to the metal line 380, the metal line 376 is located on an opposite side of the metal line 374. With respect to the metal line 388, the metal line 384 is located on an opposite side of the metal line 374. Landing pads 378 and 386 are located on opposite sides of the metal lines 376 and 384. In the metal layer M2, the metal line 390 for forming the lower power supply node CVss is located on one side of the metal line 392 for forming the word line SWL.

Compared to the layout diagram 172 in FIG. 5, the metal lines 376 and 384 in the metal layer M1 also cause the cell pitch along the X direction to be widened and therefore matched with the cell pitch CP2$_x$ shown in FIG. 9. Furthermore, because the metal line 376 couples the via 358 at a bottom portion of the layout diagram 372 to the metal line 390 at a top portion of the layout diagram 372, the metal line 390 can be arranged on one side of the metal line 392, instead of both sides as in the layout diagram 172 in FIG. 5. Therefore, a width W$_2$ of the metal line 392 has some extra space to be widened compared to a width W$_1$ of the metal line 192 in FIG. 5. In some embodiments, the width W$_2$ is larger than the width W$_1$ by a factor to at least compensate for the increase in resistance of the word line SWL due to the increase in the cell pitch CP2$_x$ (labeled in FIG. 9). In some embodiments, the factor by which the width W$_2$ is larger than the width W$_1$ is at least 10%. For example, the width W$_1$ of the metal line 192 in FIG. 5 is larger than those of the metal lines 190 and 194 by at least 15% and the width W$_2$ of the metal line 392 in FIG. 11 is larger than that of the metal line 390 by at least 30%. In other embodiments, the factor by which the width W$_2$ is larger than the width W$_1$ is at least 30% to further reduce the resistance of the word line SWL. In some embodiments, an upper limit for the width W$_2$ is equal to the sum of the width W$_1$ of the metal line 192, a width of the metal line 194 and a spacing between adjacent boundaries of the metal line 192 and the metal line 194 in FIG. 5. An upper limit of the factor by which the width W$_2$ is larger than the width W$_1$ is determined based on the upper limit of the width W$_2$. With the increased number of fins for the N-FETs SPG$_1$ and SPG$_2$ and the widened metal line 392 for the word line SWL with the increased cell pitch CP2$_x$, the speed performance of the cell SC (shown in FIG. 2) implemented as the layout diagrams 312 and 372 in FIGS. 9 and 11 is improved.

Figure 12:
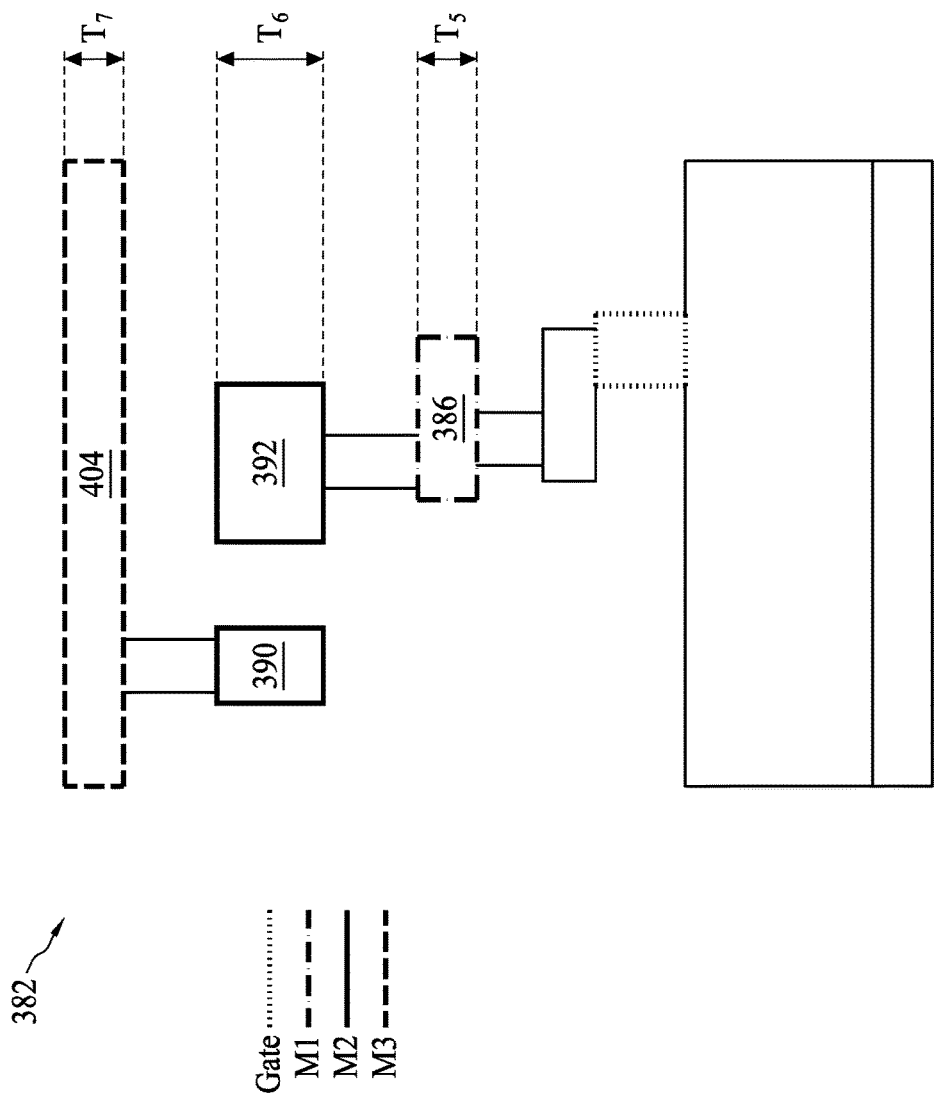
FIG. 12 is a schematic cross-sectional diagram taken along line C-C' in FIG. 11 in accordance with other embodiments.

FIG. 12 is a cross-sectional diagram 382 of the cell SC in FIG. 2 in accordance with other embodiments. The cross-sectional diagram 382 includes a cross-section of the BEOL portion taken along line C-C' in FIG. 11 and a cross-section of the FEOL portion correspondingly taken along line C-C' in FIG. 9. Compared to the cross-sectional diagram 182 in FIG. 6 in which the metal lines 190 and 194 are formed on both sides of the metal line 192, the metal line 390 is formed on one side of the metal line 392. Furthermore, the via 400 (shown in FIG. 11), the metal line 384 and the via 366 are not stacked under the metal line 390 as the corresponding via 200, landing pad 184 and via 166 stacked under the metal line 190 in the cross-sectional diagram 182. As shown in FIG. 11, the via 400, the metal line 384 and the via 366 are moved to a position between the metal line 388 and the via 406.

Similar to FIG. 6, the metal layer M1 includes the metal line 386 and has a thickness T$_5$; the metal layer M2 includes the metal lines 390 and 392 and has a thickness T$_6$; and the metal layer M3 includes the metal line 404 and has a thickness T$_7$. The thickness T$_6$ is larger than the thickness T$_5$ and the thickness $T_7$ by a factor equal to at least about 15%. In other embodiments, the factor is equal to at least about 30%. In still other embodiments, the factor is equal to at least about 40%. The value 15%, 30% or 40% is the lower limit of the factor. Embodiments for determining the lower limit and the upper limit of the factor have been provided above with reference to FIG. 6. The benefits for increasing the thickness $T_6$ of the layer M2 and for limiting the thickness $T_5$ of the layer M1 are similar the benefits of increasing the thickness $T_2$ of the layer M2 and limiting the thickness $T_1$ of the layer M1 in FIG. 6.

The additional metal line 210 extended in parallel to the metal line 192 described with references to FIGS. 7 and 8 is also applicable to various embodiments. Similar to FIG. 7, the metal line 210 of the metal layer M4 may be disposed above the metal line 404. When the thickened metal line 210 is extended in parallel and coupled to the metal line 392, the resistance of the word line SWL is further decreased. The benefit of the metal line 210 has been described in the above paragraphs related to FIG. 8, and the detailed description is omitted here for brevity.

In some embodiments, a semiconductor chip includes both a first SRAM macro including cells implemented by the embodiments described with references to FIGS. 3 to 6 and a second SRAM macro including cells implemented by the embodiments described with references to FIGS. 9 to 12. The first SRAM macro is configured to improve array density in an area of the semiconductor chip and the second SRAM macro is configured to enhance array performance in another area of the semiconductor chip.

The foregoing outlines features of SRAM cell with metal lines for lower power supply node on opposite sides of pair of bit line and complementary bit line so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

DRAM Macro

Figure 13:
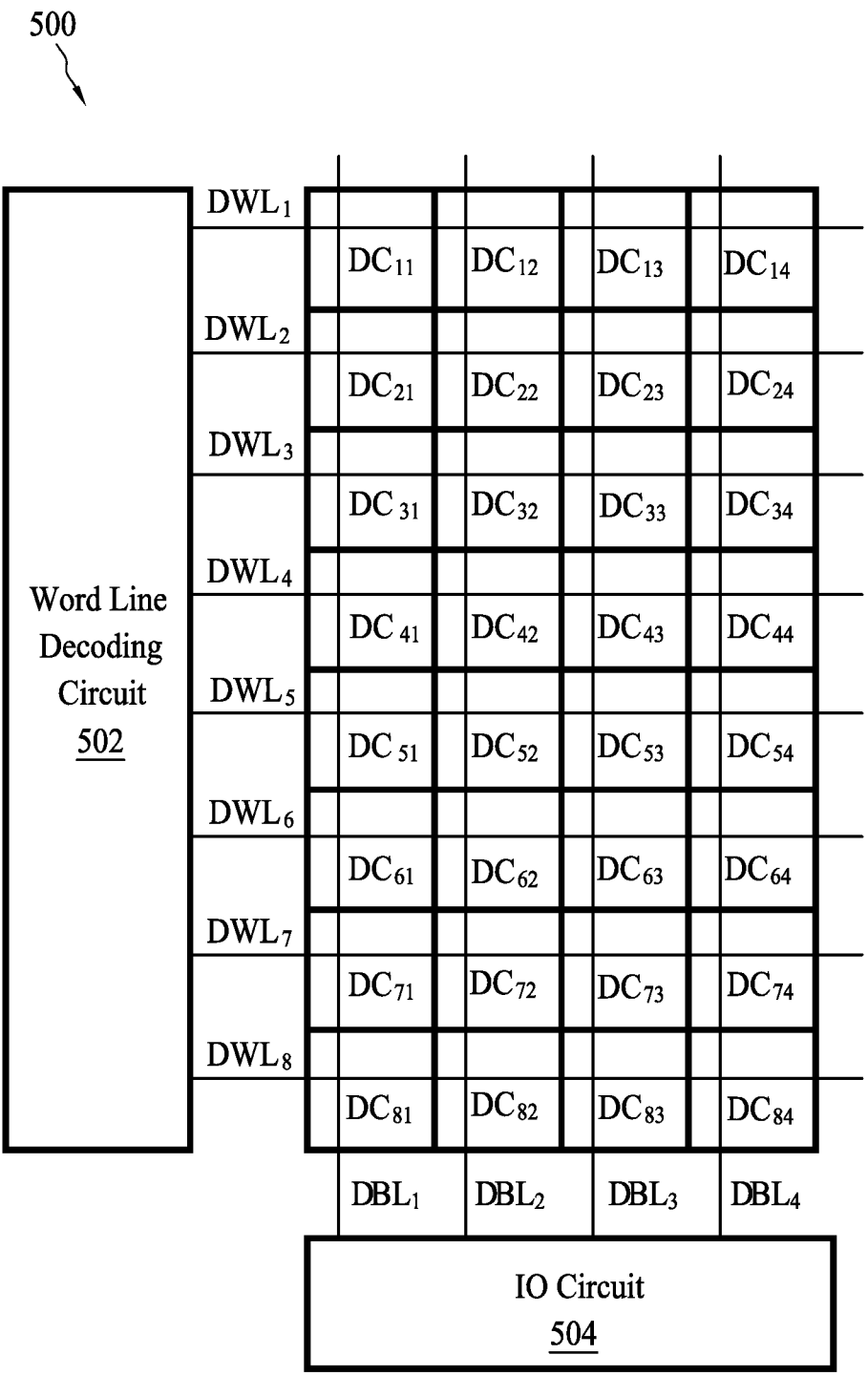
FIG. 13 is a schematic block diagram of a dynamic random access memory (DRAM) array in accordance with some embodiments.

FIG. 13 is a block diagram of a dynamic random access memory (DRAM) array 500 in accordance with some embodiments. Compared to the SRAM macro 100 in FIG. 1, one corresponding bit line $DBL_1$, $DBL_2$, . . . or $DBL_4$ is running along each column of the DRAM macro 500.

The DRAM macro 500 includes an array of cells $DC_{11}$, $DC_{12}$, . . . and $DC_{84}$, a word line decoding circuit 502 and an IO circuit 504. The word line decoding circuit 502 drives a plurality of word lines $DWL_1$, $DWL_2$, . . . and $DWL_8$ running along corresponding rows of cells $DC_{11}$ to $DC_{14}$, $DC_{21}$ to $DC_{24}$, . . . and $DC_{81}$ to $DC_{84}$. The IO circuit 504 drives or receives the plurality of bit lines $DBL_1$, $DBL_2$, . . . and $DBL_4$ running along corresponding columns of cells $DC_{11}$ to $DC_{81}$, $DC_{12}$ to $DC_{82}$, . . . and $DC_{14}$ to $DC_{84}$. In some embodiments, because each column of cells $DC_{11}$ to $DC_{81}$, $DC_{12}$ to $DC_{82}$, . . . or $DC_{14}$ to $DC_{84}$ has the corresponding single-ended bit line $DBL_1$, $DBL_2$, . . . or $DBL_4$, a corresponding sense amplifier is connected the single-ended bit line $DBL_1$, $DBL_2$, . . . or $DBL_4$ on one end and a reference voltage on the other end.

Each of the word lines $DWL_1$, $DWL_2$, . . . and $DWL_8$ includes a metal line that runs along the corresponding row of cells $DC_{11}$ to $DC_{14}$, $DC_{21}$ to $DC_{24}$, . . . or $DC_{81}$ to $DC_{84}$ and enables the corresponding row of cells $DC_{11}$ to $DC_{14}$, $DC_{21}$ to $DC_{24}$, . . . or $DC_{81}$ to $DC_{84}$ when asserted. When the number of columns of the DRAM macro 500 is increased, the metal line for the word line $DWL_1$, $DWL_2$ . . . or $DWL_8$ is lengthened, causing resistance of the word line $DWL_1$, $DWL_2$ . . . or $DWL_8$ to be increased. In addition, down-scaling dimensions of the metal line with the advancement of technology also causes the resistance of the word line $DWL_1$, $DWL_2$ . . . or $DWL_8$ to be increased. Due to the increase in resistance of the word line $DWL_1$, $DWL_2$ . . . or $DWL_8$ delay in enabling access of the corresponding row of cells $DC_{11}$ to $DC_{14}$, $DC_{21}$ to $DC_{24}$, . . . or $DC_{81}$ to $DC_{84}$ is increased. Each bit line $DBL_1$, $DBL_2$ . . . or $DBL_4$ includes a metal line that runs along the corresponding column of cells $DC_{11}$ to $DC_{81}$, $DC_{12}$ to $DC_{82}$, . . . or $DC_{14}$ to $DC_{84}$, and transmit data to be sensed from or written to the cell $DC_{11}$, $DC_{12}$, . . . or $DC_{84}$. In some situations, when the number of rows is increased, the metal line for each bit line $DBL_1$, $DBL_2$ . . . or $DBL_4$ is lengthened, resulting in capacitance on each bit line $DBL_1$, $DBL_2$ . . . or $DBL_4$ to be increased and delay for the differential voltages to be established for sensing or written is increased.

Figure 14:
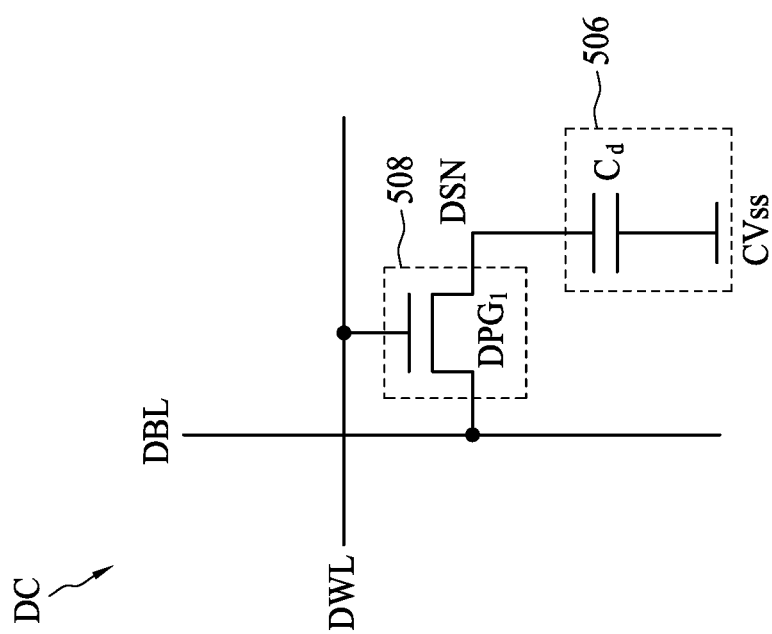
FIG. 14 is a schematic circuit diagram of the cell in the DRAM macro in FIG. 13 in accordance with some embodiments.

FIG. 14 is a schematic circuit diagram of the cell $DC_{11}$, $DC_{12}$, . . . or $DC_{84}$ (representatively denoted as DC) in the DRAM macro 500 in FIG. 13 in accordance with some embodiments. Compared to the cell SC in FIG. 2, the cell DC includes a storage device 506 that is configured with a lower power supply node CVss, and a storage node DSN. The cell DC includes the storage device 506 and an access device 508. The storage device 506 is configured to hold data at the storage node DSN. The access device 508 is configured to couple a bit line DBL to the storage node SSN in response to a signal at a word line DWL.

In some embodiments, the storage device 506 includes a capacitive device $C_d$. An anode of the capacitive device $C_d$ is coupled to the storage node DSN. A cathode of the capacitive device $C_d$ is coupled to the lower power supply node CVss. The access device 508 includes an N-FET $DPG_1$ of which a gate is coupled to the word line DWL, a first source or drain is coupled to the storage node SSN and a second source or drain is coupled to the bit line DBL.

By applying the principle described with references to FIGS. 6 and 12 for the cell SC shown in FIG. 2 to the cell DC shown in FIG. 14, a metal layer in which the metal line for forming the word line DWL resides has a thickness larger than that of a metal layer in which the metal line for forming the bit line DBL resides, and that of a metal layer in which the metal line for forming the lower power supply node CVss presents. In this way, the resistance of the word line DWL is decreased, thereby improving speed performance of the DRAM macro 500 (shown in FIG. 13). In addition, the capacitance on each bit line DBL is limited, thereby limiting the capacitive load asserted on the bit line DBL that adversely impacts delay for sensing or writing data. Furthermore, routing density in the metal layer in which the metal line for forming the lower power supply node CVss exists is increased compared to the metal layer in which the metal line for the word line DWL resides.

The foregoing outlines features of DRAM macro so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Pixel Array

Figure 15:
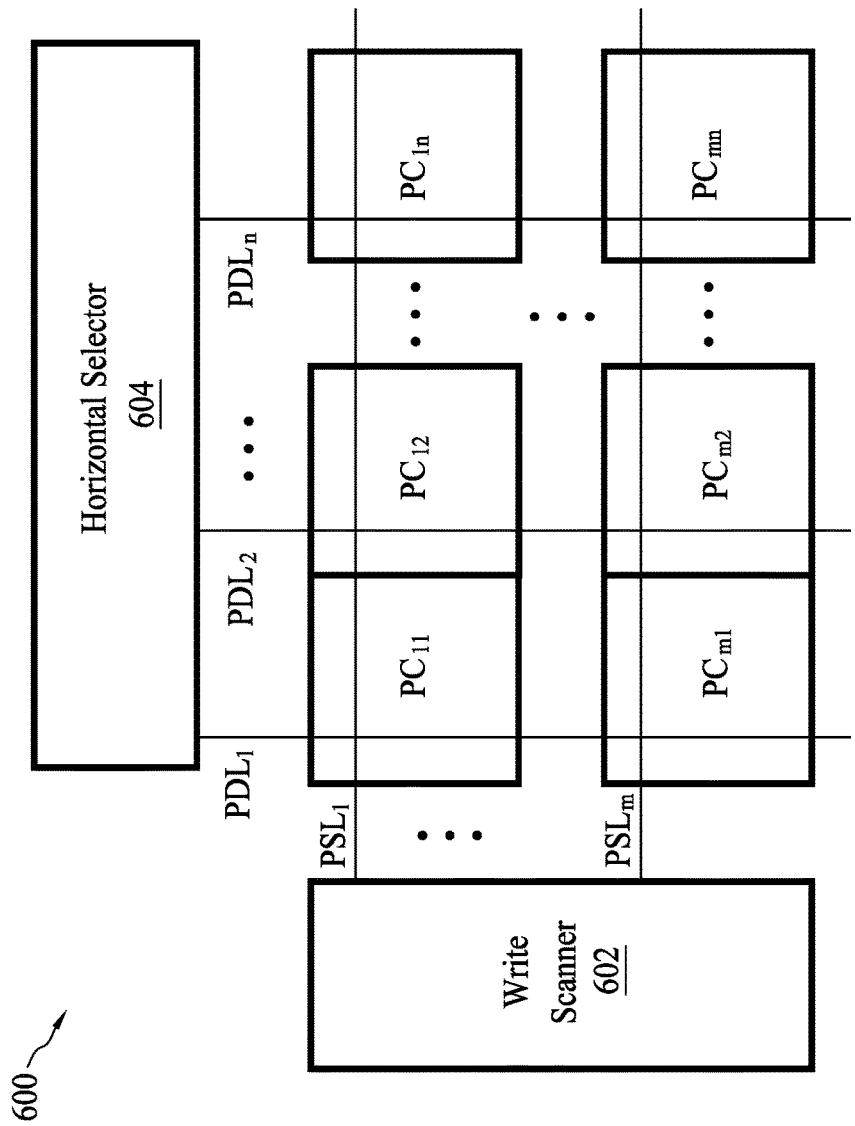
FIG. 15 is a schematic block diagram of a pixel array in accordance with some embodiments.
Figure 16:
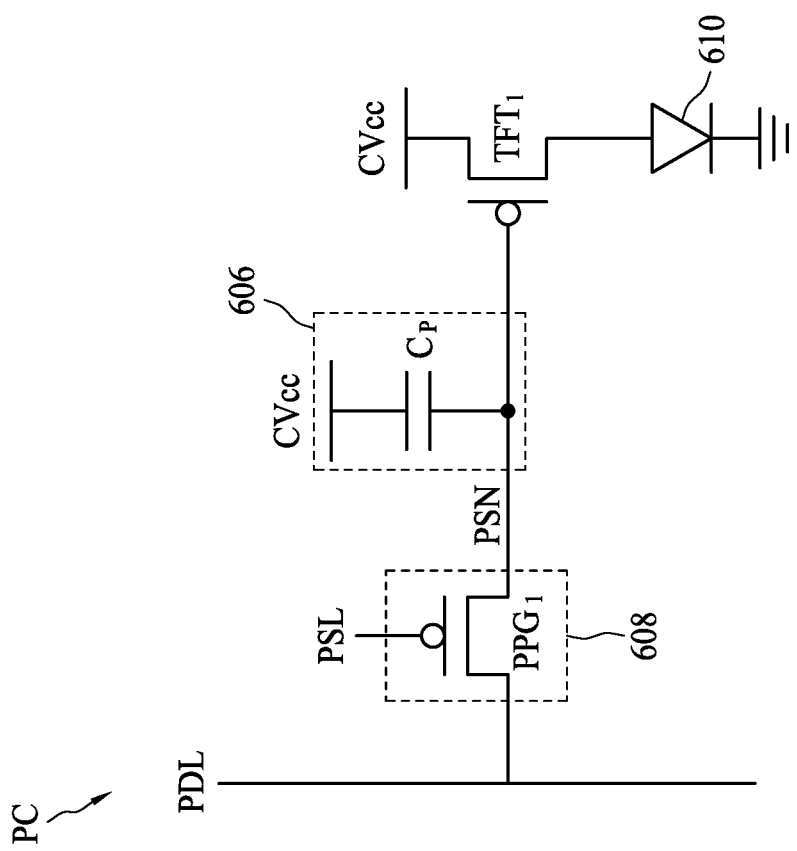
FIG. 16 is a schematic circuit diagram of a cell in the pixel array in FIG. 15 in accordance with some embodiments.

FIG. 15 is a schematic block diagram of a pixel array 600 in accordance with some embodiments. FIG. 16 is a schematic circuit diagram of a cell PC in the pixel array 600 in FIG. 15 in accordance with some embodiments. Compared to the cell DC of the DRAM macro 600 in FIG. 14, a storage device 606 of the cell PC is configured with a higher power supply node CVcc and a storage node PSN.

In FIG. 15, the pixel array 600 includes an array of cells $PC_{11}$, $PC_{12}$, . . . and $PC_{mn}$, a write scanner 602 and a horizontal selector 604. Each of a plurality of scanning lines $PSL_1$, . . . and $PSL_m$ includes a metal line running along corresponding rows of cells $PC_{11}$ to $PC_{1n}$, . . . and $PC_{m1}$ to $PC_{mn}$. The write scanner 602 successively selects and drives the plurality of scanning lines $PSL_1$, . . . and $PSL_m$. Each of a plurality of data lines $PDL_1$, $PDL_2$, . . . and $PDL_n$ includes a metal line running along corresponding columns of cells $PC_{11}$ to $PC_{m1}$, . . . and $PC_{n1}$ to $PC_{mn}$. The horizontal selector 604 successively selects a plurality of data lines $PDL_1$, $PDL_2$, . . . and $PDL_n$ and successively supplies luminance data to the data lines $PDL_1$, $PDL_2$, . . . and $PDL_n$.

In FIG. 16, the pixel cell PC includes the storage device 606, an access device 608, a p-type thin film effect transistor $TFT_1$ and a light emitting element 610. The light emitting element 610 is implemented as an organic EL light emitting element (OLED). The storage device 606 is configured with the higher power supply node CVcc and the storage node PSN. The storage device 606 is configured to hold the luminance data at the storage node PSN. The access device 508 is configured to couple a data line PDL to the storage node PSN in response to a signal at a scanning line PSL. The transistor $TFT_1$ has a gate coupled to the storage node PSN, a source coupled to the higher power supply node CVcc, and a drain coupled to an anode of the light emitting element 610. A cathode of the light emitting element 610 is coupled to a lower power supply node Gnd.

In some embodiments, the storage device 606 includes a capacitive device $C_p$. An anode of the capacitive device $C_p$ is coupled to the higher power supply node CVcc. A cathode of the capacitive device $C_p$ is coupled to the storage node PSN. The access device 608 includes a P-FET $PPG_1$ of which a gate is coupled to the scanning line PSL, a first source or drain is coupled to the storage node PSN and a second source or drain is coupled to the data line PDL.

When the P-FET $PPG_1$ couples the data line PDL to the storage node PSN in response to the signal at the scanning line PSL, a voltage potential across the capacitive device $C_p$ is established in accordance with the luminance data at the data line PDL. The transistor $TFT_1$ is turned ON in response to a voltage level at the storage node PSN and thereby generates a current flowing through the light emitting element 610. The light emitting element 610 emits a light with the given luminance in accordance with the value of the current. When the P-FET $PPG_1$ is turned OFF in response to the signal at the scanning line PSL, the capacitive device $C_p$ holds the voltage level at the storage node PSN, thereby causing the transistor $TFT_1$ to continue to generate the current flowing through the light emitting element 610, and the light emitting element 610 continues to emit a light with the given luminance until next update through the P-FET $PPG_1$.

By applying the principle described with references to FIG. 6 and FIG. 12 for the cell SC (shown in FIG. 2) to the cell PC (shown in FIG. 16), a metal layer in which the metal line for forming the scanning line PSL resides has a thickness larger than that of a metal layer in which the metal line for forming the data line PDL resides, and that of a metal layer in which a metal line for forming the higher power supply node CVcc presents. In this way, the resistance of the scanning line PSL is decreased, thereby improving speed performance of the pixel array 600 (shown in FIG. 15). In addition, capacitance on each data line PDL is limited, thereby limiting the capacitive load asserted on the data line PDL that adversely impacts delay for writing luminance data. Furthermore, routing density in the metal layer in which the metal line for forming the higher power supply node CVcc exists is increased over the metal layer in which the metal line for the scanning line PSL resides.

Embodiments for the SRAM macro 100, the DRAM macro 500 and the pixel array 600 have been described with references to FIGS. 1 to 16. Other types of circuits having an array are within the contemplated scope of the disclosure. For example, row lines of the array of the circuit may be implemented in a manner similar to the word lines $SWL_1$, . . . and $SWL_8$ in FIG. 1, the word lines $DWL_1$, . . . and $DWL_8$ in FIG. 13, and the scanning lines $PSL_1$, . . . and $PSL_m$ in FIG. 15. Similarly, column lines of the array may be implemented in a manner similar to the bit lines and complementary bit lines $SBL_1$ and $SBLB_1$ . . . and $SBL_4$ and $SBLB_4$ in FIG. 1, the bit lines $DBL_1$, . . . and $DBL_4$ in FIG. 13, and the data lines $PDL_1$, . . . and $PDL_n$ in FIG. 15.

The foregoing outlines features of pixel array so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Logic Circuits

Figure 17:
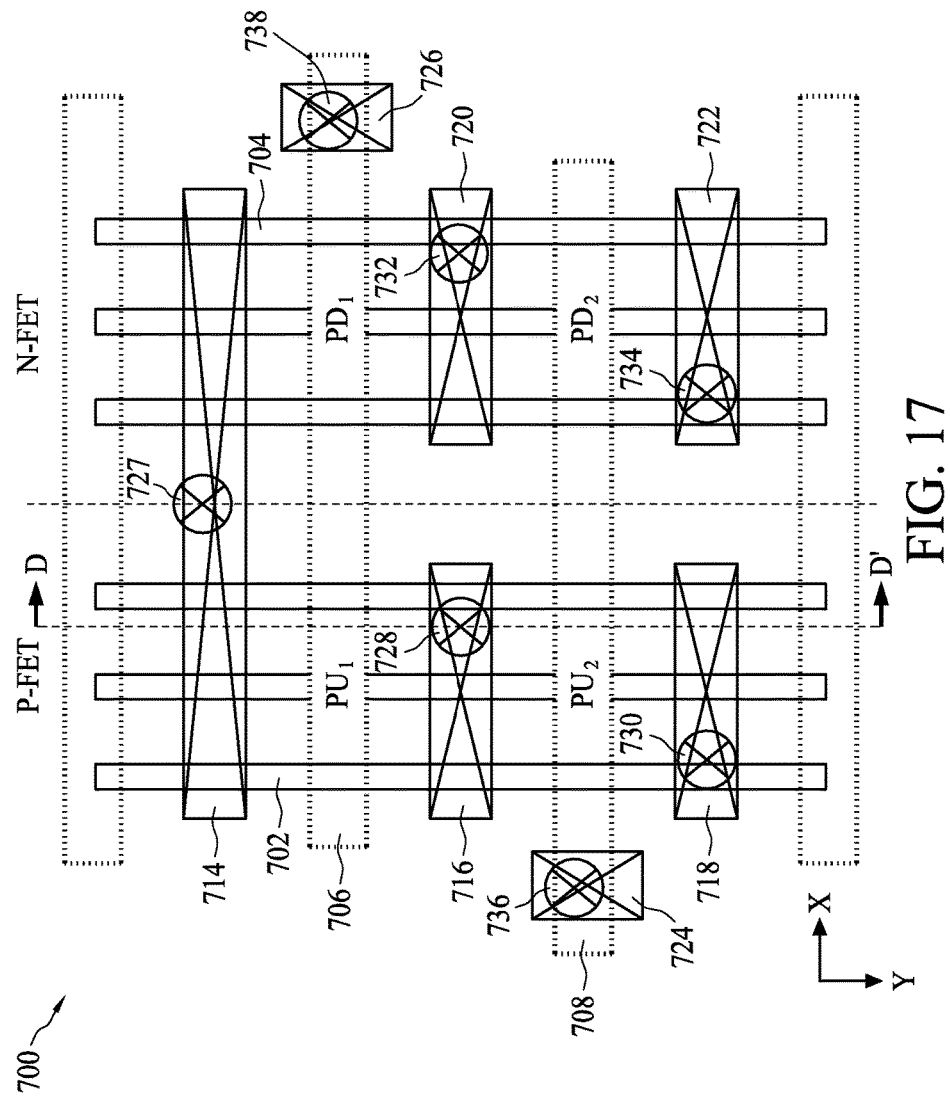
FIG. 17 is a schematic layout diagram of an FEOL and via0 layer portion of an exemplary logic circuit in accordance with some embodiments.
Figure 18:
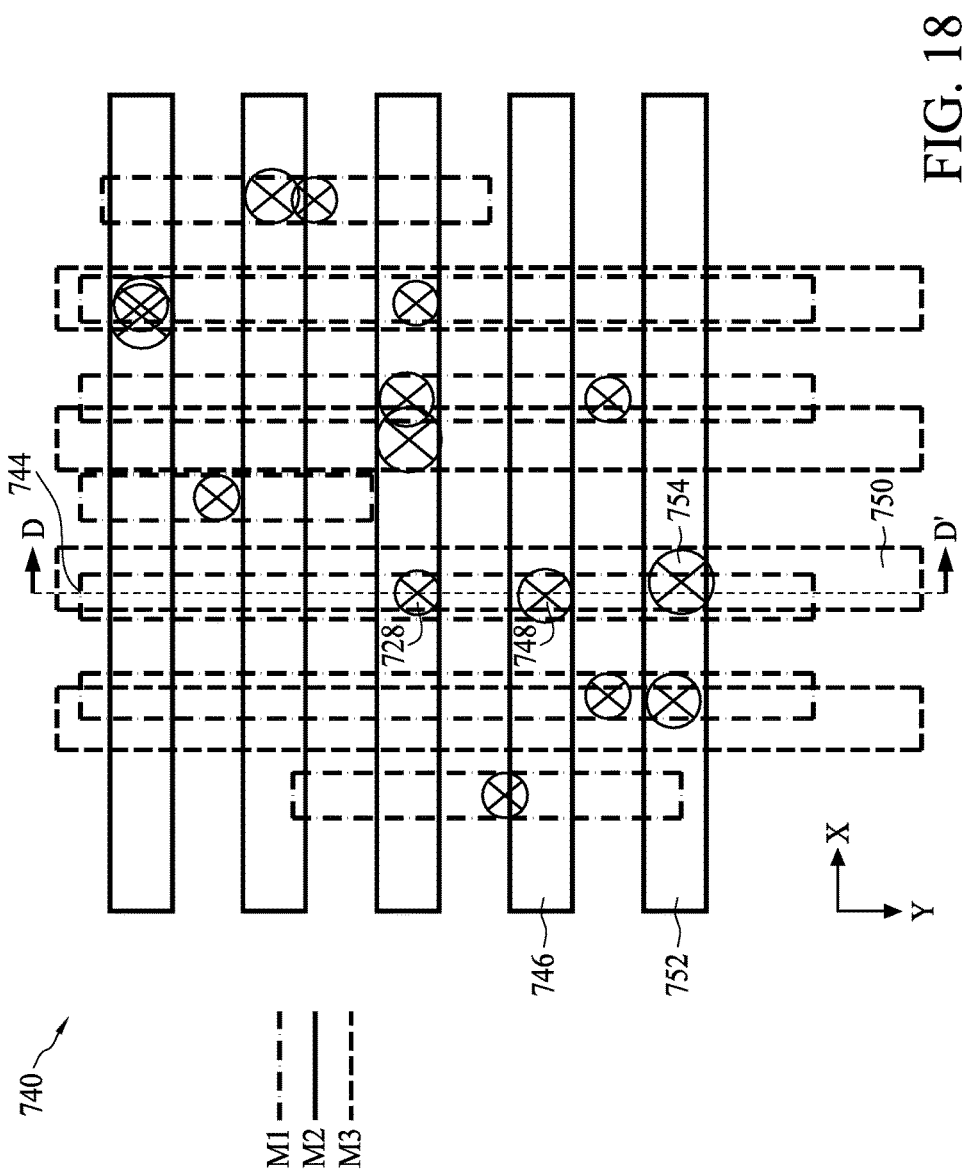
FIG. 18 is a schematic layout diagram of a BEOL portion of the logic circuit in accordance with some embodiments.
Figure 19:
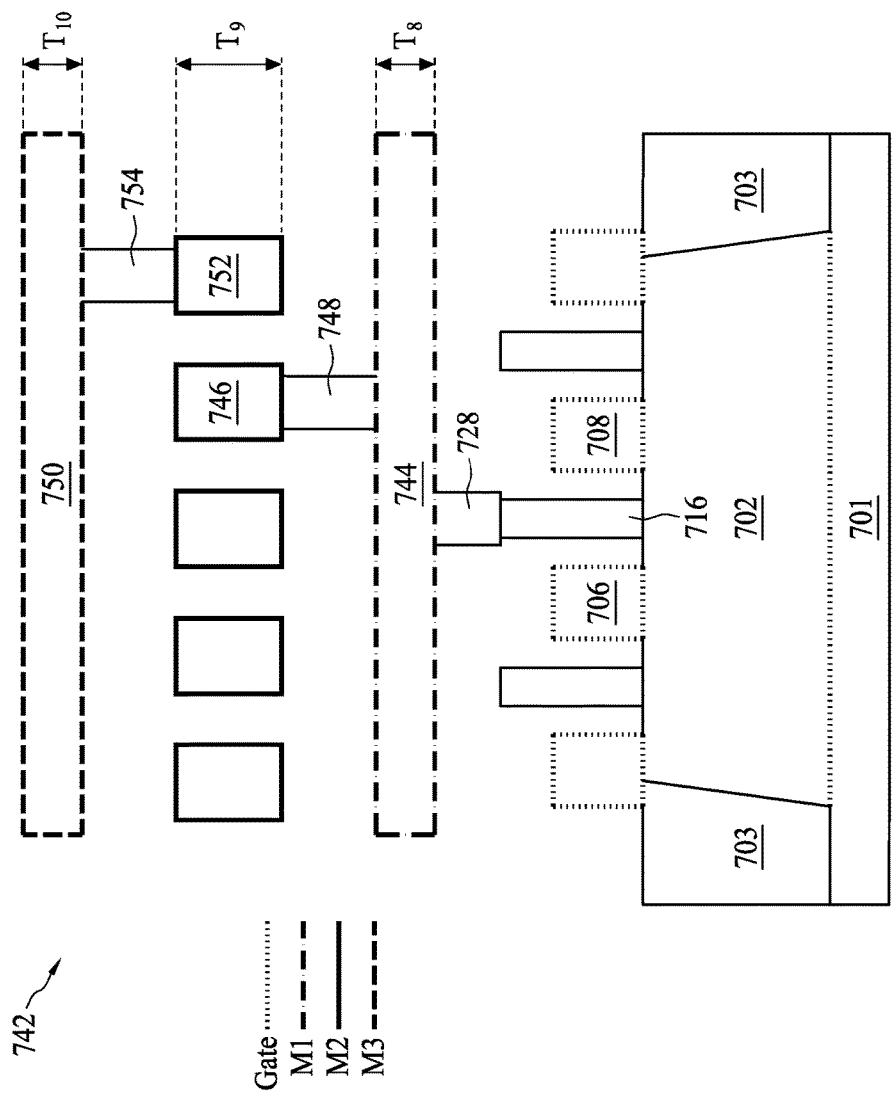
FIG. 19 is a schematic cross-sectional diagram taken along line D-D' in FIG. 18 in accordance in some embodiments.

FIG. 17 is a layout diagram 700 of an FEOL and via0 layer portion of an exemplary logic circuit in accordance with some embodiments. FIG. 18 is a layout diagram 740 of a BEOL portion of the logic circuit in accordance with some embodiments. FIG. 19 is a schematic cross-sectional diagram 742 taken along line D-D' in FIG. 17 and in FIG. 18 in accordance in some embodiments. FIGS. 17 to 19 illustrate that the principle of increasing a thickness for a metal layer to be thicker than an upper metal layer and a lower metal layer can also be applied to logic circuits to reduce the resistance of a metal line in the metal layer, limits the capacitance on a metal line in the lower metal layer and increase a routing density of the upper metal layer over that of the metal layer.

In FIG. 17, the layout diagram 700 includes two portions. The left portion corresponds to P-FETs $PU_1$ and $PU_2$ and the right portion corresponds to N-FETs $PD_1$ and $PD_2$. The P-FET $PU_1$ has three fin structures 702 running substantially along the Y direction and a gate structure 706 running substantially along the X direction. The N-FET PD$_1$ has three fin structures 704 running substantially along the Y direction and the gate structure 706 extended from the P-FET PU$_1$. A contact 714 couples a drain region of the P-FET PU$_1$ in the fin structures 702 to a drain region of the N-FET PD$_1$ in the fin structures 704. A via 727 in the via0 layer is formed over and coupled to the contact 714. A contact 716 is coupled to a source region of the P-FET PU$_1$ in the fin structures 702. A via 728 in the via0 layer is formed over and coupled to the contact 716. A contact 720 is coupled to a source region of the N-FET PD$_1$ in the fin structures 704. A via 732 in the via0 layer is formed over and coupled to the contact 720. A contact 726 is coupled to the gate structure 706. A via 738 in the via0 layer is formed over and coupled to the contact 726.

The P-FET PU$_2$ has the fin structures 702 extended from the P-FET PU$_1$ and a gate structure 708 running substantially along the X direction. The N-FET PD$_2$ has the fin structures 704 extended from the N-FET PD$_1$ and the gate structure 708 extended from the P-FET PU$_2$. A source region of the P-FET PU$_2$ is shared with the source region of the P-FET PU$_1$. The contact 716 and the via 728 are also shared between the P-FETs PU$_1$ and PU$_2$. A contact 718 is coupled to a drain region of the P-FET PU$_2$ in the fin structures 702. A via 730 in the via0 layer is formed over and coupled to the contact 718. A source region of the N-FET PD$_2$ is shared with the source region of the N-FET PD$_1$. The contact 720 and the via 732 are also shared between the N-FETs PD$_1$ and PD$_2$. A contact 734 is coupled to a drain region of the N-FET PD$_2$ in the fin structures 704. A via 734 in the via0 layer is formed over and coupled to the contact 722. A contact 724 is coupled to the gate structure 708. A via 736 in the via0 layer is formed over and coupled to the contact 724.

In FIG. 18, the layout diagram 740 includes the metal layer M1, the metal layer M2, the metal layer M3, the via0 layer under the metal layer M1, the via1 layer interposed between the metal layers M1 and M2 and the via2 layer interposed between the metal layers M2 and M3. In the layout diagram 740, a plurality of metal lines in the metal layer M1 such as a metal line 744 are running substantially along the Y direction and are formed over and coupled to the corresponding vias in the via0 layer such as a via 728. A plurality of metal lines in the metal layer M2 such as metal lines 746 and 752 are running substantially along the X direction and are formed over and coupled to the corresponding metal lines in the metal layer M1 through corresponding vias in the via1 layer. For example, the metal line 746 is coupled to the metal line 744 in the metal layer through the via 748 in the via1 layer. A plurality of metal lines in the metal layer M3 such as a metal line 750 are running substantially along the Y direction and are formed over and coupled to the corresponding metal lines in the metal layer M2 such as a meta line 752 through corresponding vias in the via2 layer such as a via 754.

The cross-sectional diagram 742 in FIG. 19 includes a cross-section of the BEOL portion taken along line D-D' in FIG. 18 and a cross-section of the FEOL portion corresponding taken at line D-D' in FIG. 17. The FEOL portion includes a substrate 701, the fin structure 702, dielectric isolation structures 703, the gate structures 706 and 708 and the source contact 716. The fin structure 702 stands on the substrate 701. The dielectric isolation structures 703 are formed over the substrate 701 and surround the fin structure 702. Each of the gate structures 706 and 708 wraps around a portion of the fin structure 702 and therefore is shown to be above the fin structure 702 in the cross-sectional diagram 742. The source contact 716 is formed over and in contact with a source region of the fin structure 702.

The BEOL portion includes a structure of stacked metal layers. The stacked metal layers includes the metal line 744 in the metal layer M1, the metal lines 746 and 752 in the metal layer M2, the metal line 750 in the metal layer M3, the via 728 in the via0 layer, the via 748 in the via1 layer and the via 754 in the via2 layer. The via0 layer, metal layer M1, via1 layer, metal layer M2, via2 layer and metal layer M3 are stacked in order.

In some embodiments, a thickness $T_9$ of the metal layer M2 is larger than a thickness $T_8$ of the metal layer M1 immediately below the metal layer M2 and a thickness $T_{10}$ of the metal layer M3 immediately above the metal layer M2 by a factor equal to at least about 15%. In other embodiments, the factor is equal to at least about 30%. In still other embodiments, the factor is equal to at least about 40%. The value 15%, 30% or 40% is the lower limit of the factor. Embodiments for determining the lower limit and the upper limit of the factor have been provided above with reference to FIG. 6.

FIGS. 17-19 only illustrate one logic circuit. However, this is not a limitation of the present disclosure. An array of logic circuits also belongs to the scope of the present disclosure, for example. In some embodiments, the array of logic circuits may have the similar configuration as FIG. 1, FIG. 13, or FIG. 15. When the array of logic circuits is configured to be the similar configuration of FIG. 1, FIG. 13, or FIG. 15, the methods disclosed in FIG. 6, FIG. 8, and FIG. 12 may also be applied in the array of logic circuits for improving the chip density and speed performance. As the method is described in above paragraphs, the detailed description is omitted here for brevity.

Moreover, the methods disclosed in FIG. 1-FIG. 19 may be applied to any array circuit having a first set of signal lines, a second set of signal lines and a third set of power lines for improving the chip density and/or speed performance of the array circuit. The first set of signal lines may be signal lines with a first direction and the second set of signal lines may be signal lines with a second direction different from the first direction. The third set of power lines may be power lines with a third direction substantially the same as the first direction. For example, the first set of signal lines may be horizontal input/output signal lines and the second set of signal lines may vertical input/output signal lines. The third set of power lines may be horizontal power lines.

In the SRAM cell SC described with reference to FIGS. 5 to 6, 7 to 8, 11 to 12, the metal lines for the bit line SBL and the complementary bit lines SBLB are arranged in the metal layer M1, the metal line for the word line SWL is arranged in the metal layer M2 or the metal lines for the word line SWL are arranged in the metal layers M2 and M4, and one of the metal lines for the lower power supply node CVss is arranged in the metal layer M3. However, this is not a limitation of the present disclosure. The SRAM cells with the bit line SBL, the complementary bit line SBLB, the word line SWL and the lower power supply node CVss arranged in other metal layers such as metal layers M2, M3, or M3 and M5, and M4, metal layers M3, M4, or M4 and M6, and M5, metal layers M4, M5, or M5 and M7, and M6, etc. are within the contemplated scope of the present disclosure. Similar arrangements apply to the DRAM cells DC described with reference to FIG. 14 and the pixel cells PC described with reference to FIG. 15. Furthermore, in the logic circuit described with reference to FIGS. 18 and 19, the metal lines running substantially in parallel to the direction of the fin structures 702 and 704 are arranged in the metal layer M1, the metal lines running substantially in parallel to the direction of the gate structures 706 and 708 are arranged in the metal layer M2, and the metal lines running substantially orthogonal to the direction of the metal lines in the metal layer M2 are arranged in the metal layer M3. This is also not a limitation of the present disclosure. The logic circuits with the metal lines running substantially in parallel to the fin structures, gate structures and the metal lines in the metal layer M1 arranged in other metal layers, such as metal layers M2, M3 and M4, metal layers M3, M4 and M5, and metal layers M4, M5 and M6, etc., are within the contemplated scope of the present disclosure.

Some embodiments have one or a combination of the following features and/or advantages. In some embodiments, a plurality of stacked metal layers includes a metal layer having a thickness larger than a thickness of a lower metal layer immediately below the metal layer and an upper metal layer immediately above the metal layer by a factor equal to at least about 15%, 30% or 40%. In some embodiments, an array circuit includes an array of cells and the plurality of stacked metal layers configured over the array of cells. Each cell of the array of cells includes a data line including a portion of a first metal line in the lower metal layer, a control line including a portion of a second metal line in the metal layer and a power supply node including a portion of a third metal line in the upper metal layer. Due to the increased thickness in the metal layer, a resistance of the control line is decreased, thereby improving performance degradation resulted from increasing number of columns of the array of cells and down-scaling dimensions of a metal line as technology advances. In addition, owing to the limited thickness in the lower metal layer, capacitance on the first metal line for the data line is limited, thereby limiting an increase in a capacitive load asserted on the data line as the number of rows of the array of cells increase. Such increase in the capacitive load adversely impacts the performance for inputting data to and/or outputting data from the array circuit. Further, with the smaller thickness in the upper metal layer compared to the metal layer, routing density of the upper metal layer is increased over the metal layer. In some embodiments, when the fourth metal line is not disposed immediately above the upper metal layer, compactness of a semiconductor chip including such arrangement is improved.

The foregoing outlines features of logic circuits so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In some embodiments, a semiconductor chip includes a plurality of stacked conductive layers. The plurality of stacked conductive layers comprise a first conductive layer, a second conductive layer, and a third conductive layer. The first conductive layer is disposed on a first side of the second conductive layer. The third conductive layer is disposed on a second side of the second conductive layer. The third conductive layer is disposed on a side of the second conductive layer. The second conductive layer has a thickness which is thicker than those of the first conductive layer and the third conductive layer.

In some embodiments, an array cell comprises a first conductive line, a second conductive line, a storage device, and a first access device. The storage device is configured with at least a storage node and a power supply node. The first access device is configured to couple the first conductive line to the storage node in response to a signal line at the second conductive line. The first conductive line comprises a portion of a first metal line in a first conductive layer. The second conductive line comprises a portion of a second metal line in a second conductive layer. The first conductive layer is disposed on a first side of the second conductive layer. The power supply node comprises a portion of a third metal line in a third conductive layer. The third conductive layer is disposed on a second side of the second conductive layer. The second conductive layer has a thickness which is thicker than that of the third conductive layer by a factor.

In some embodiments, a semiconductor chip comprises a first array of cells. Each cell of the first array of cells comprises a first conductive line and a first complementary conductive line, a second conductive line, a first storage device, and a first access device and a second access device. The first storage device is configured with a first storage node, a first complementary storage node, a first higher power supply node and a first lower power supply node. The first access device and a second access device configured to couple the corresponding first conductive line and first complementary conductive line to the corresponding first storage node and first complementary storage node in response to a first signal at the second conductive line. The first conductive line comprises a portion of a first metal line in the first conductive layer and the first complementary conductive line comprises a portion of a second metal line in the first conductive layer. The first higher power supply node comprises a portion of a third metal line in the first conductive layer. The second conductive line comprises a portion of a fourth metal line in a second conductive layer. The first conductive layer is disposed on a first side of the second conductive layer. The first lower power supply node comprises a portion of a fifth metal line in a third conductive layer. The third conductive layer is disposed on a second side of the second conductive layer. The second conductive layer has a thickness which is thicker than that of the third conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor chip, comprising:
   a memory cell, comprising:
      a first conductive line formed in a first conductive layer;
      a second conductive line formed in a second conductive layer different from the first conductive layer; and a third conductive line formed in a third conductive layer different from the first conductive layer and the second conductive layer, wherein the first conductive line is longer than the second conductive line substantially along a first direction;

the second conductive line is longer than the first conductive line and the third conductive line substantially along a second direction orthogonal to the first direction;

the third conductive line is longer than the second conductive line substantially along the first direction;

the first conductive layer has a thickness which is thicker than that of the second conductive layer; and the third conductive layer has a thickness which is substantially equal to or thicker than that of the first conductive layer.

2. The semiconductor chip of claim 1, wherein the thickness of the first conductive layer is thicker than that of the second conductive layer by a factor equal to at least about 30%.

3. The semiconductor chip of claim 1, wherein the thickness of the third conductive layer is thicker than that of the first conductive layer by at least about 10%.

4. The semiconductor chip of claim 1, wherein the third conductive line overlaps with the first conductive line; and a conductive path from the first conductive line to the third conductive line is formed.

5. The semiconductor chip of claim 4, wherein the conductive path comprises:

a landing pad, formed in the second conductive line;

a first via, formed between the first conductive line and the landing pad; and a second via, formed between the landing pad and the third conductive line.

6. The semiconductor chip of claim 1, further comprising:

a row of switching devices each of which has a first terminal, a second terminal and a third terminal, wherein a first conductive path between the second terminal and the third terminal is connected or disconnected in response to a signal at the first terminal; and a second conductive path among all of the first terminals of the row of switching devices is formed using the first conductive line.

7. The semiconductor chip of claim 6, further comprising:

a storage device configured with a storage node and a power supply node, wherein a third conductive path from the storage node to the third terminal of one of the row of switching devices is formed; and the power supply node comprises a portion of the second conductive line.

8. A semiconductor chip, comprising:

a memory cell, comprising:

a first conductive line formed in a first conductive layer;

a second conductive line formed in a second conductive layer different from the first conductive layer;

a third conductive line formed in a third conductive layer different from the first conductive layer and the second conductive layer; and a fourth conductive line formed in a fourth conductive layer different from the first conductive layer, the second conductive layer, and the third conductive layer, wherein the first conductive line is longer than the second conductive line substantially along a first direction;

the second conductive line is longer than the first conductive line and the third conductive line substantially along a second direction;

the third conductive line is longer than the second conductive line and the fourth conductive line substantially along the first direction;

the fourth conductive line is longer than the third conductive line substantially along the second direction; and the first direction is orthogonal to the second direction.

9. The semiconductor chip of claim 8, wherein the second conductive layer has a thickness which is thicker than those of the first conductive layer and the third conductive layer;

the fourth conductive layer has a thickness which is substantially equal to or thicker than that of the second conductive layer; and each of the thicknesses of the first conductive layer, the second conductive layer, the third conductive layer and the fourth conductive layer is substantially along a third direction orthogonal to the first direction and the second direction.

10. The semiconductor chip of claim 9, wherein the thickness of the second conductive layer is thicker than that of the first conductive layer and/or that of the third conductive layer by a factor equal to at least about 30%.

11. The semiconductor chip of claim 9, wherein the thickness of the fourth conductive layer is thicker than that of the second conductive layer by at least about 10%.

12. The semiconductor chip of claim 8, wherein the fourth conductive line overlaps with the second conductive line; and a conductive path from the second conductive line to the fourth conductive line is formed.

13. The semiconductor chip of claim 8, further comprising:

a row of switching devices each of which has a first terminal, a second terminal and a third terminal, wherein a first conductive path between the second terminal and the third terminal is connected or disconnected in response to a signal at the first terminal; and a second conductive path among all of the first terminals of the row of switching devices is formed using the second conductive line.

14. The semiconductor chip of claim 13, further comprising:

a storage device configured with a storage node and a power supply node, wherein
a third conductive path from the storage node to the third terminal of one of the row of switching devices is formed; and
the power supply node comprises a portion of the third conductive line.

15. The semiconductor chip of claim 8, further comprising:
a column of switching devices each of which has a first terminal, a second terminal and a third terminal,
wherein
a first conductive path between the second terminal and the third terminal is connected or disconnected in response to a signal at the first terminal;
no conductive path from the first terminal to the second terminal is formed;
no conductive path from the first terminal to the third terminal is formed; and
a second conductive path among all of the second terminals of the column of switching devices is formed using the first conductive line.

16. An array cell, comprising:
a first conductive line formed in a first conductive layer and running substantially along a first direction;
a second conductive line formed in a second conductive layer and running substantially along a second direction orthogonal to the first direction;
a third conductive line formed in a third conductive layer;
a first switching device having a first terminal, a second terminal and a third terminal;
wherein
a first conductive path between the second terminal and the third terminal is connected or disconnected in response to a signal at the first terminal;
a second conductive path from the first terminal to the second conductive line is formed;
a third conductive path from the second terminal to the first conductive line is formed;
the second conductive layer has a thickness which is substantially thicker than those of the first conductive layer and the third conductive layer; and
each of the thicknesses of the first conductive layer, the second conductive layer and the third conductive layer is substantially along a third direction orthogonal to the first direction and the second direction.

17. The array cell of claim 16, further comprising:
a storage device configured with a storage node and a power supply node;
wherein
a fourth conductive path from the storage node to the third terminal of the first switching device is formed; and
the power supply node comprises the third conductive line.

18. The array cell of claim 17, further comprising:
a fourth conductive line formed in the first conductive layer;
a second switching device having a fourth terminal, a fifth terminal and a sixth terminal;
wherein
a fifth conductive path between the fifth terminal and the sixth terminal is connected or disconnected in response to the signal at the fourth terminal;
no conductive path from the fourth terminal to the fifth terminal is formed;
no conductive path from the fourth terminal to the sixth terminal is formed;
a sixth conductive path from the fourth terminal to the second conductive line is formed;
a seventh conductive path from the fifth terminal to the fourth conductive line is formed;
the power supply node is a lower power supply node;
the storage device is further configured with a complementary storage node and a higher power supply node;
an eighth conductive path from the complementary storage node to the sixth terminal is formed;
the higher power supply node comprises a fifth conductive line in the first conductive layer; and
the first conductive line and the fourth conductive line are formed in parallel to and on opposite sides of the fifth conductive line.

19. The array cell of claim 18, wherein
the lower power supply node further comprises:
a sixth conductive line and a seventh conductive line in the second conductive layer; and
the sixth conductive line and the seventh conductive line are formed substantially in parallel to and on opposite sides of the second conductive line.

20. The array cell of claim 18, wherein
the lower power supply node further comprises:
a sixth conductive line and a seventh conductive line in the first conductive layer; and
an eighth conductive line in the second conductive layer;
the sixth conductive line and the seventh conductive line are formed substantially in parallel to and on opposite sides of a pair of the first conductive line and the fourth conductive line; and
the eighth conductive line is formed substantially in parallel to and on one side of the second conductive line.

* * * * *